(12) United States Patent
Tasaki et al.

(10) Patent No.: US 11,326,065 B2
(45) Date of Patent: *May 10, 2022

(54) SILICONE RESIN REFLECTIVE SUBSTRATE, MANUFACTURING METHOD FOR SAME, AND BASE MATERIAL COMPOSITION USED IN REFLECTIVE SUBSTRATE

(71) Applicant: ASAHI RUBBER INC., Saitama (JP)

(72) Inventors: Masutsugu Tasaki, Saitama (JP); Naoto Igarashi, Saitama (JP); Akira Ichikawa, Saitama (JP); Tsutomu Odaki, Saitama (JP); Maimi Yoshida, Saitama (JP)

(73) Assignee: ASAHI RUBBER INC., Saitama (JP)

(*) Notice: Subject to any disclaimer, the term of this patent is extended or adjusted under 35 U.S.C. 154(b) by 183 days.

This patent is subject to a terminal disclaimer.

(21) Appl. No.: 16/693,471

(22) Filed: Nov. 25, 2019

(65) Prior Publication Data

US 2020/0095430 A1    Mar. 26, 2020

Related U.S. Application Data

(62) Division of application No. 15/399,058, filed on Jan. 5, 2017, now Pat. No. 10,533,094, which is a division
(Continued)

(30) Foreign Application Priority Data

Mar. 23, 2010    (JP) .................................. 2010-065888

(51) Int. Cl.
*C09D 7/62*       (2018.01)
*B29C 48/00*      (2019.01)
(Continued)

(52) U.S. Cl.
CPC ................ *C09D 7/62* (2018.01); *B29C 45/14* (2013.01); *B29C 48/002* (2019.02);
(Continued)

(58) Field of Classification Search
CPC ........ C09D 7/62; C09D 5/004; C09D 183/04; H01L 31/0682; H01L 31/02008;
(Continued)

(56) References Cited

U.S. PATENT DOCUMENTS 4,087,585 A    5/1978    Schulz
5,194,649 A    3/1993    Okawa
(Continued)

FOREIGN PATENT DOCUMENTS

CN    1534074 A    10/2004
CN    1642707 A     7/2005
(Continued)

OTHER PUBLICATIONS

Creating Tomorrow's Solutions Silres H62 C Impregnating Resin for Vacuum Pressure Impregnation (VPI).
(Continued)

*Primary Examiner* — Nathan L Van Sell
(74) *Attorney, Agent, or Firm* — Oliff PLC

(57) ABSTRACT

A versatile silicone resin reflective substrate which exhibits high reflectance of high luminance light from an LED light source over a wide wavelength from short wavelengths of approximately 340-500 nm, which include wavelengths from 380-400 nm near lower limit of the visible region, to longer wavelength in the infra-red region. The silicone resin reflective substrate has a reflective layer which contains a white inorganic filler powder dispersed in a three-dimensional cross linked silicone resin, the inorganic filler powder having a high reflective index than the silicone resin. The reflective layer is formed on a support body as a film, a solid,
(Continued)

or a sheet. The silicone resin reflective substrate can be easily formed as a wiring substrate, a packaging case or the like, and can be manufactured at low cost and a high rate of production.

28 Claims, 8 Drawing Sheets

Related U.S. Application Data of application No. 13/636,963, filed as application No. PCT/JP2010/073445 on Dec. 24, 2010, now Pat. No. 9,574,050.

(51) Int. Cl.

| | |
|---|---|
| *B29C 45/14* | (2006.01) |
| *C09D 183/04* | (2006.01) |
| *H01L 31/0224* | (2006.01) |
| *H01L 31/0352* | (2006.01) |
| *H01L 31/048* | (2014.01) |
| *H01L 33/60* | (2010.01) |
| *C08L 83/04* | (2006.01) |
| *H01L 31/054* | (2014.01) |
| *H01L 31/068* | (2012.01) |
| *C08G 77/04* | (2006.01) |
| *B29C 59/04* | (2006.01) |
| *C08K 3/22* | (2006.01) |
| *C08K 9/02* | (2006.01) |
| *C08K 9/06* | (2006.01) |
| *C09C 1/36* | (2006.01) |
| *C09C 3/12* | (2006.01) |
| *C09D 5/33* | (2006.01) |
| *H01L 31/02* | (2006.01) |
| *H01L 33/56* | (2010.01) |
| *H01L 33/62* | (2010.01) |
| *B29C 48/07* | (2019.01) |
| *B29C 48/08* | (2019.01) |
| *B29C 48/13* | (2019.01) |
| *B29C 48/16* | (2019.01) |
| *B29C 48/154* | (2019.01) |
| *B29C 48/155* | (2019.01) |
| *B29K 705/10* | (2006.01) |
| *B29L 7/00* | (2006.01) |
| *B29D 11/00* | (2006.01) |
| *B29K 83/00* | (2006.01) |
| *B29K 105/20* | (2006.01) |
| *B29L 9/00* | (2006.01) |

(52) U.S. Cl.
CPC .......... *B29C 48/0022* (2019.02); *B29C 59/04* (2013.01); *C08G 77/04* (2013.01); *C08K 3/22* (2013.01); *C08K 9/02* (2013.01); *C08K 9/06* (2013.01); *C08L 83/04* (2013.01); *C09C 1/3684* (2013.01); *C09C 3/12* (2013.01); *C09D 5/004* (2013.01); *C09D 183/04* (2013.01); *H01L 31/02008* (2013.01); *H01L 31/022425* (2013.01); *H01L 31/03529* (2013.01); *H01L 31/035281* (2013.01); *H01L 31/048* (2013.01); *H01L 31/0481* (2013.01); *H01L 31/0547* (2014.12); *H01L 31/068* (2013.01); *H01L 31/0682* (2013.01); *H01L 33/56* (2013.01); *H01L 33/60* (2013.01); *H01L 33/62* (2013.01); *B29C 48/07* (2019.02); *B29C 48/08* (2019.02); *B29C 48/13* (2019.02); *B29C 48/154* (2019.02); *B29C 48/155* (2019.02); *B29C 48/16* (2019.02); *B29C 2793/0027* (2013.01); *B29D 11/0074* (2013.01); *B29K 2083/00* (2013.01); *B29K 2105/20* (2013.01); *B29K 2705/10* (2013.01); *B29K 2995/003* (2013.01); *B29L 2007/002* (2013.01); *B29L 2009/005* (2013.01); *C08K 2003/2241* (2013.01); *H01L 2224/13* (2013.01); *H01L 2224/45144* (2013.01); *H01L 2224/48091* (2013.01); *Y02E 10/52* (2013.01); *Y02E 10/547* (2013.01); *Y10T 428/24355* (2015.01); *Y10T 428/24413* (2015.01); *Y10T 428/24612* (2015.01); *Y10T 428/256* (2015.01); *Y10T 428/269* (2015.01); *Y10T 428/31663* (2015.04)

(58) Field of Classification Search
CPC ..... H01L 33/56; H01L 33/62; H01L 31/0547; H01L 31/022425; H01L 31/035281; H01L 31/03529; H01L 31/0481; H01L 33/60; H01L 31/048; H01L 31/068; H01L 2224/45144; H01L 2224/13; H01L 2224/48091; B29C 48/002; B29C 48/0022; B29C 59/04; B29C 45/14; B29C 48/07; B29C 48/08; B29C 48/13; B29C 48/16; B29C 48/154; B29C 48/155; B29C 2793/0027; C08K 3/22; C08K 9/02; C08K 9/06; C08K 2003/2241; C08K 3/013; C09C 1/3684; C09C 3/12; C08L 83/04; C08G 77/04; B29D 11/0074; B29K 2083/00; B29K 2105/20; B29K 2995/003; B29K 2705/10; B29L 2009/005; B29L 2007/002; Y10T 428/31663; Y10T 428/256; Y10T 428/24355; Y10T 428/24612; Y10T 428/24413; Y10T 428/269; Y02E 10/547; Y02E 10/52

See application file for complete search history.

(56) References Cited

U.S. PATENT DOCUMENTS

| | | | |
|---|---|---|---|
| 5,599,894 | A | 2/1997 | Ikeno |
| 5,883,171 | A | 3/1999 | Matsushita et al. |
| 6,632,892 | B2 | 10/2003 | Rubinsztajn et al. |
| 7,569,989 | B2 | 8/2009 | Nitta et al. |
| 7,990,606 | B2 | 8/2011 | Hakii |
| 2002/0061392 | A1 | 5/2002 | Jacobsen et al. |
| 2004/0018347 | A1 | 1/2004 | Jacobsen et al. |
| 2004/0067366 | A1 | 4/2004 | Gorczyca |
| 2005/0046018 | A1 | 3/2005 | Jacobsen et al. |
| 2005/0230864 | A1 | 10/2005 | Ozasa et al. |
| 2006/0159937 | A1 | 7/2006 | Miyoshi et al. |
| 2006/0226758 | A1 | 10/2006 | Sofue et al. |
| 2006/0261366 | A1 | 11/2006 | Yang |
| 2007/0112112 | A1 | 5/2007 | Kerschner et al. |
| 2007/0112146 | A1 | 5/2007 | Falk et al. |
| 2007/0132060 | A1 | 6/2007 | Kuwajima et al. |
| 2008/0036087 | A1 | 2/2008 | Jacobsen et al. |
| 2008/0117619 | A1 | 5/2008 | Pang et al. |
| 2008/0160322 | A1* | 7/2008 | Mochizuki ............ H01L 23/296 428/447 |
| 2008/0210966 | A1 | 9/2008 | Sakamoto et al. |
| 2009/0045422 | A1 | 2/2009 | Kato et al. |
| 2009/0057708 | A1 | 3/2009 | Abdul Karim et al. |
| 2009/0110917 | A1 | 4/2009 | Albaugh et al. |
| 2009/0171013 | A1 | 7/2009 | Taguchi et al. |
| 2009/0189180 | A1 | 7/2009 | Murai et al. |
| 2009/0194320 | A1 | 8/2009 | Okumura |
| 2009/0242847 | A1 | 10/2009 | Hosoya et al. |
| 2009/0246499 | A1 | 10/2009 | Katsoulis et al. |
| 2009/0267099 | A1 | 10/2009 | Sakai |
| 2009/0309116 | A1 | 12/2009 | Kato et al. |

(56) References Cited

U.S. PATENT DOCUMENTS

| | | | |
|---|---|---|---|
| 2010/0171440 A1 | 7/2010 | Satou et al. | |
| 2011/0236632 A1 | 9/2011 | Hosokawa et al. | |

FOREIGN PATENT DOCUMENTS

| | | | |
|---|---|---|---|
| CN | 101519531 A | 9/2009 | |
| EP | 1 967 540 A1 | 9/2008 | |
| EP | 2 075 280 A1 | 7/2009 | |
| EP | 2 448 026 A1 | 5/2012 | |
| JP | H05315654 A | 11/1993 | |
| JP | 2001-207059 A | 7/2001 | |
| JP | 2003-501676 A | 1/2003 | |
| JP | 2004-012810 A | 1/2004 | |
| JP | 2006-124600 A | 5/2006 | |
| JP | 2006-240073 A | 9/2006 | |
| JP | 2006-316173 A | 11/2006 | |
| JP | 2006-324623 A | 11/2006 | |
| JP | 2006-343445 A | 12/2006 | |
| JP | 2008-135390 A | 6/2008 | |
| JP | 2008-143981 A | 6/2008 | |
| JP | 2008-159713 A | 7/2008 | |
| JP | 2008-222828 A | 9/2008 | |
| JP | 2008-251316 A | 10/2008 | |
| JP | 2009-010360 A | 1/2009 | |
| JP | 2009-021394 A | 1/2009 | |
| JP | 2009-129801 A | 6/2009 | |
| JP | 2009-164275 A | 7/2009 | |
| JP | 2009-182149 A | 8/2009 | |
| JP | 2010-010279 A | 1/2010 | |
| JP | 2010-232252 A | 10/2010 | |
| KR | 10-2009-0074758 A | 7/2009 | |
| WO | 2007/074892 A1 | 7/2007 | |
| WO | 2008/018548 A1 | 2/2008 | |

OTHER PUBLICATIONS

Dec. 14, 2015 Office Action issued in European Application No. 10 848 500.4.

May 10, 2016 Office Action Issued in U.S. Appl. No. 13/636,963.

Gubbels et al., Dec. 2005/Jan. 2006, The Use of Silicone Materials in Close Proximity of Electrical Motors and Mechanical Relays, eDrive, vol. 6, Issue 6.

Mar. 22, 2011 International Search Report issued in International Application No. PCT/JP2010/073445.

Jun. 3, 2013 Office Action issued in U.S. Appl. No. 13/380,661.

Dec. 19, 2017 Office Action issued in Chinese Application No. 201610312226.4.

Jun. 1, 2015 Office Action issued in Chinese Patent Application No. 201080065663.1.

Sep. 26, 2018 Office Action issued in Chinese Patent Application No. 201610312226.4.

Sep. 1, 2015 Office Action issued in Chinese Patent Application No. 201080065663.1.

Apr. 11, 2019 Office Action issued in Chinese Patent Application No. 201610312226.4.

Aug. 9, 2016 Office Action issued in Korean Patent Application No. 10-2012-7027662.

Aug. 2, 2013 Supplementary European Search Report issued in European Patent Application No. 10848500.4.

Jun. 23, 2021 Office Action issued in European Patent Application No. 19150557.7.

Jan. 2, 2018 Summons for Oral Proceedings issued in European Patent Application No. 10848500.4.

Oct. 29, 2018 Decision to Refuse European Patent Application issued in European Patent Application No. 10848500.4.

Nov. 27, 2014 Office Action issued in Chinese Patent Application No. 201080065663.1.

Aug. 13, 2018 Trial Decision issued in Korean Patent Application No. 10-2012-7027662.

Feb. 28, 2017 Office Action issued in Korean Patent Application No. 10-2012-7027662.

\* cited by examiner

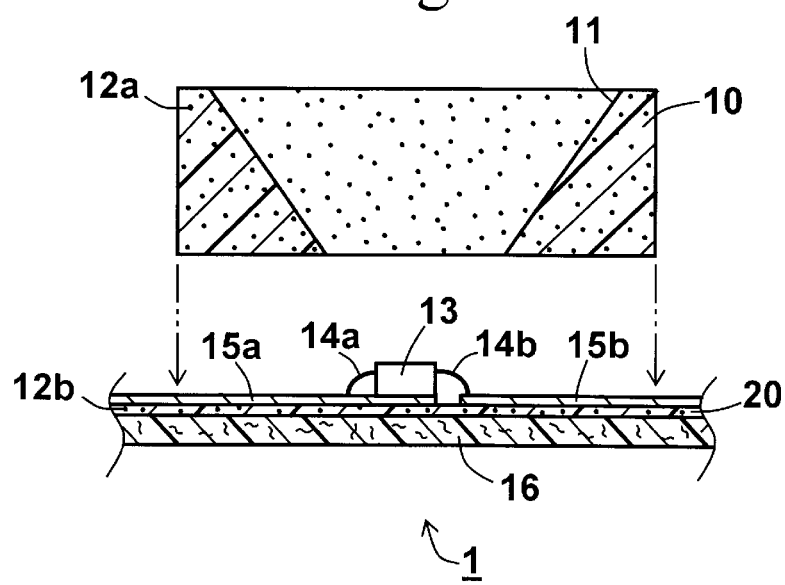
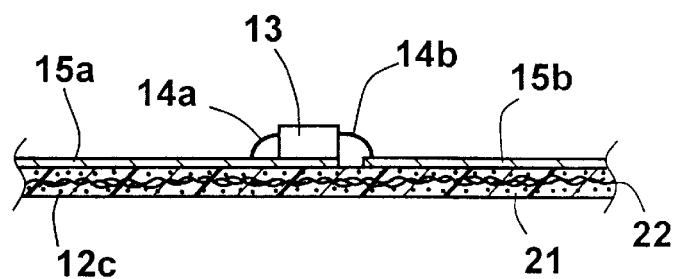

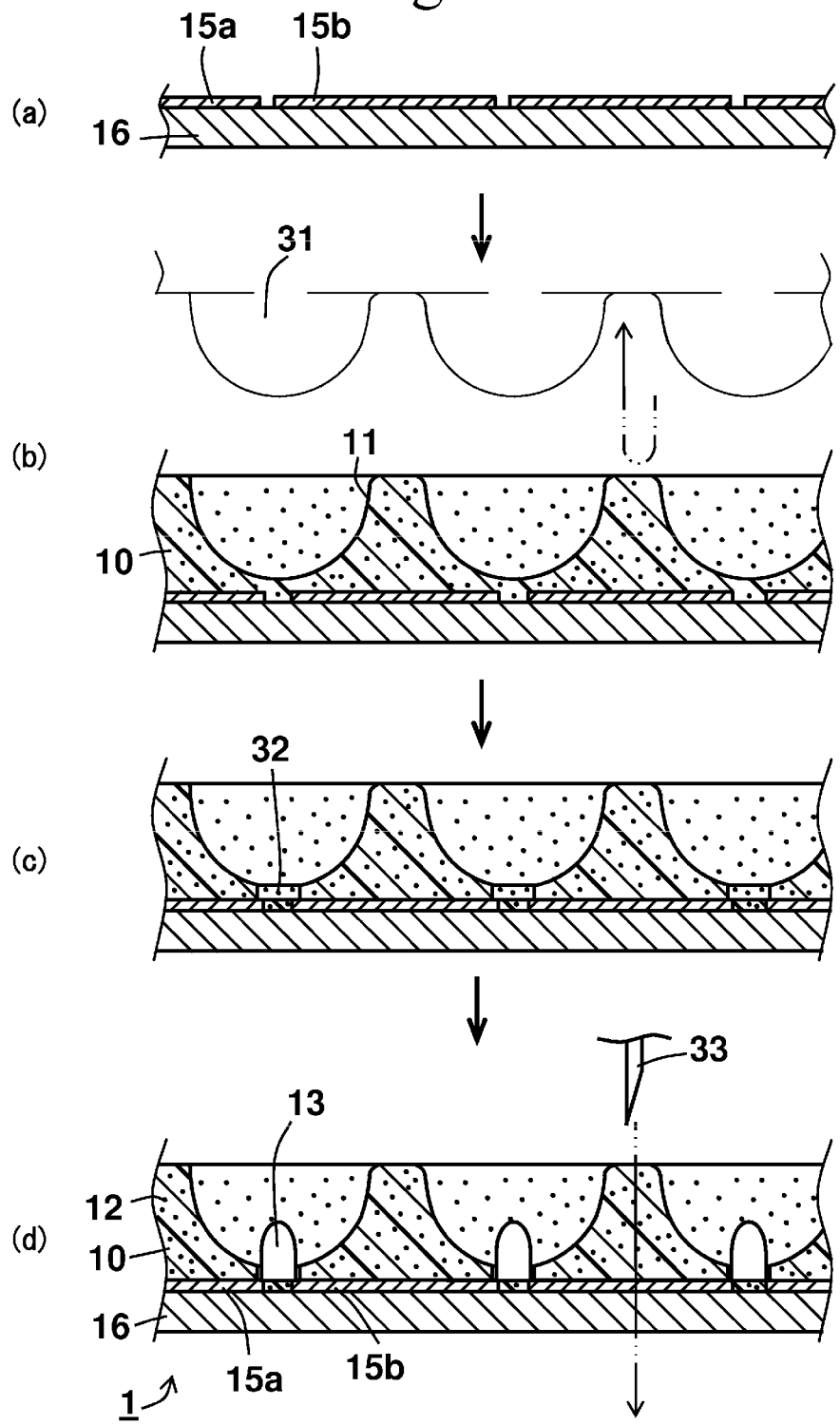

SILICONE RESIN REFLECTIVE SUBSTRATE, MANUFACTURING METHOD FOR SAME, AND BASE MATERIAL COMPOSITION USED IN REFLECTIVE SUBSTRATE

TECHNICAL FIELD

This application is a divisional of application Ser. No. 15/399,058 filed Jan. 5, 2017, which is a divisional of application Ser. No. 13/636,963 filed Sep. 24, 2012, which is a National Stage Application of PCT/JP2010/73445 filed Dec. 24, 2010 and claims the benefit of Japanese Application No. 2010-065888 filed Mar. 23, 2010. The entire disclosures of the prior applications are hereby incorporated by reference herein their entirety.

The present invention relates to a silicone resin reflective substrate which is mounted, for example on a light emitting device such as a lighting apparatus or the like, which is used to reflect light from a light source in the direction to be irradiated, and which is alternatively used to reflect incoming light so that light is collected to a photoelectric conversion element, relates to a manufacturing method for the reflective substrate, and also relates to a base material composition which is used to form the reflective substrate.

BACKGROUND ART

As a light source for various light emitting devices such as a lighting device, a signal, a backlight for a liquid crystal display panel, etc., a light emitting device which emits a desired wavelength light like light emitting diode (LED) is used. Such light emitting diode, especially high brightness light emitting diode is brighter, when compared to a white color lighting device such as a filament lamp, mercury lamp, fluorescent bulb, etc., consumes less electricity and in addition has a long life. Therefore, it is used in many indoor or outdoor luminescent devices. In addition, in a solar cell assembly, photoelectric conversion element comprising P and N type silicones which performs photoelectric conversion is usually installed.

A wiring substrate on which a light emitting and absorbing element such as a light-emitting element and a photoelectric-conversion element is mounted or a package case that surrounds and accommodates these elements, is formed with a ceramic-made or resin-made reflecting substrate to reflect light from the light source in a direction to be irradiated or to reflect and collect light which enters a solar cell assembly toward a photoelectric-conversion element in order to carry out an energy conversion efficiently.

If the reflective substrate of the wiring base plate and the package case is made of ceramics, exiting light tends to leak, accordingly it is difficult to obtain the reflection efficiency.

As a resin-made reflective substrate, on the other hand, a base plate of a support body such as a sheet-like glass fiber is immersed into a resin composition containing an epoxy resin which contains an alicyclic epoxy resin, a glycidyl (meth)acrylate base polymer, a white pigment and a curing agent, as essential ingredients and then dried, to obtain a white prepreg (Japanese Patent Publication 2006-316173A).

Resin compositions made of such resins, liquid crystal polymers, polyamide, bismaleimide•triazine (BT) resins, etc. have too low viscosity, so that the thickness of the coated layer made of such resins can be a few μm thick at best for a single coating process, therefore the base of the support body is seen through the coated resin. Therefore, it is difficult to obtain sufficient reflection efficiency. When a large amount of resin is forcibly coated, resin tends to drip down, and volatilization of solvent occurs at the surface of the coated layer, so that wrinkles and unevenness in thickness are observed between the center and edge portions of the coated layer. Therefore, a plurality of coating and drying processes are carried out to form a white-colored reflecting layer having a desired reflectance and thickness (several dozens μm).

Alternatively, the reflective substrate has been formed by curing a non-silicone base high viscous varnish which contains reflective components.

In addition, the reflective substrates made of such resins or varnishes generally have a poor heat and light resistance. And yellowing is observed. The substrates have a tendency to absorb light having a wavelength of 400 nm or less, accordingly they cannot reflect light efficiently. Further, these reflective substrates made of such resins or varnishes can be produced easily and at a low cost, but in a re-flow process of a recent lead-free soldering, the substrates are heated up to about 300° C., initial degradation such as yellowing is observed. In addition, recently, the wavelength of emitting light has become shorter and emission power has become higher. Yellowing and degradation over time is seen under a high temperature caused by high-brightness white emission light. And the surface of the substrates become dull, and the decrease in reflective efficiency is also observed. Thereby, initially-designed illumination performance is degraded and their surface becomes dark, being inconvenient.

Versatile and simple reflective substrates, which can sufficiently reflect light having a wide wavelength range from a short wavelength of 340-500 nm to a longer wavelength such as the infrared region which are emitted from LED light sources, which can be used for wiring substrates and packages of solar cell assemblies as well as light emitting devices, and which show excellent heat and light resistance, excellent heat conductivity and light reflectance, no deterioration in light reflectance for a long period of time, is required.

Further, a simple manufacturing method for reflective substrates having reflective layers on support bodies having various shapes is also required. Further, a simple manufacturing method for reflective substrates having enough reflectance whose reflective layer can be made by single thick coating of reflective-layer base material compositions which can be formed into a film-like, 3-dimension-like or plate-like shape, is required. Further, a base material composition having a simple compounding recipe, which can be usable for forming a reflective layer having sufficient reflectance by a single thick coating of the base material composition and can be usable for reflective substrate, is also required.

SUMMARY OF INVENTION

The present invention was made to solve the problems described above and an object of the present invention is to provide a silicone resin reflective substrate which exhibits high reflectance of a light from an LED light source over a wide wavelength from short wavelengths of approximately 340-500 nm, which include wavelengths from approximately 380-400 nm near the lower limit of the visible region, to longer wavelengths in the infra-red region. The silicone resin reflective substrate also exhibits superior thermal conductivity, light fastness, heat resistance, weather resistance, and flame resistance without deterioration such as yellowing caused over time by the irradiation of the light. The silicone resin reflective substrate further exhibits mechanical and chemical stability, the ability to maintain a white color for a long period of time, and superior adhesion to metals and resins. The silicone resin reflective substrate can be easily formed as a wiring substrate, a packaging case or the like, and can be manufactured at a low cost and a high rate of production.

In addition, the present invention was made to provide a reflective-layer base material composition capable of forming a reflective layer by a single thick coating of the composition on a support body having various shapes and to provide a manufacturing method for an easy-to-produce silicone-resin reflective substrate which can be formed into a film-like, 3-dimensional-like or plate-like substrate having a sufficient reflectance using the base material composition.

The invention relates to a silicone resin reflective substrate, which is made to achieve an object of the present invention, is characterized in that the silicone resin reflective substrate which has a reflective layer that contains a white inorganic filler powder dispersed in a three-dimensionally cross-linked silicone resin, the white inorganic filler powder having a higher refractive index than that of the three-dimensionally cross-linked silicone resin, the reflective layer being formed on a support body as a film-like shape, 3-dimensional-like shape or plate-like shape.

The invention relates to the silicone resin reflective substrate, wherein the silicone resin contains a non-cyclic dimethylsiloxy repeating unit as a main component.

The invention relates to the silicone resin reflective substrate, wherein an amount of a low-molecular weight polysiloxane having 4-10 siloxy group repeating units in the silicone resin is 300 ppm at a maximum.

The invention relates to the silicone resin reflective substrate, wherein the reflective layer is formed to have a thickness of 1-2,000 μm.

The invention relates to the silicone resin reflective substrate, wherein a refractive index of the silicone resin is not less than 1.35 and less than 1.65.

The invention relates to the silicone resin reflective substrate, wherein the white inorganic filler powder is at least one of a light reflective agent selected from the group consisting of titanium oxide, alumina, barium sulfate, magnesia, aluminum nitride, boron nitride, barium titanate, kaolin, talc, calcium carbonate, zinc oxide, silica, mica powder, glass powder, nickel powder, and aluminum powder.

The invention relates to the silicone resin reflective substrate, wherein the white inorganic filler powder is subjected to a silane coupling treatment and dispersed in the silicone resin.

The invention relates to the silicone resin reflective substrate, wherein the white inorganic filler powder is an anatase-type titanium oxide, a rutile-type titanium oxide, the alumina or the barium sulfate.

The invention relates to the silicone resin reflective substrate, wherein the titanium oxide is surface-treated and covered with Al, $Al_2O_3$, ZnO, $ZrO_2$ and/or $SiO_2$.

The invention relates to the silicone resin reflective substrate, wherein the white inorganic filler powder has an average particle size of 0.05-50 μm and is contained in the silicone resin in a ratio of 2-80% by mass.

The invention relates to the silicone resin reflective substrate, wherein the white inorganic filler powder and a fluorescent substance are dispersed and contained in the reflective layer.

The invention relates to the silicone resin reflective substrate, wherein at least one of the white inorganic filler powder and the fluorescent substance is exposed to the air on a surface of the reflective layer.

The invention relates to the silicone resin reflective substrate, wherein the surface of the reflective layer is made into a continuous non-specular surface of a nanometer-size concavo-convex shape, prism shape and/or pearskin shape.

The invention relates to the silicone resin reflective substrate, wherein a part of the white inorganic filler powder is exposed to the air on the surface of the silicone resin by treating at least a part of the surface of the silicone resin reflective substrate using a polishing, roughening, die molding using scabrous die, stamp molding and/or chemical etching.

The invention relates to the silicone resin reflective substrate, wherein the reflective layer which covers the support body to which a conductive pattern is attached, is polished, so that the conductive pattern is exposed to the air.

The invention relates to the silicone resin reflective substrate, wherein a metal film is attached to the surface.

The invention relates to the silicone resin reflective substrate, wherein the metal film is made of at least one of a metal selected from the group consisting of Cu, Ag, Au, Ni and Pd.

The invention relates to the silicone resin reflective substrate, wherein the metal film is a plating film, metal evaporating film, a metal spraying film or a bonded metal foil.

The invention relates to the silicone resin reflective substrate, wherein the silicone resin reflective substrate is arranged at a back side, an outer periphery and/or a reflective surface of a light guiding material of either one of a light emitting element, la light emitting device and a photoelectric conversion element.

The invention relates to a method for manufacturing the silicone resin reflective substrate, the method comprising following steps of:

preparing a base material composition by dispersing a white inorganic filler powder having a higher refractive index than that of the silicone resin into a polymerizable silicone resin base material which is to be polymerized into a three-dimensionally-crosslinked silicone resin;

attaching the base material composition to a support body in a film-like shape; and three-dimensionally crosslinking the base material composition into a silicone resin having a film-like, three-dimensional-like or plate-like reflective layer on the support body.

The invention relates to the method for manufacturing the silicone resin reflective substrate, wherein the polymerization is carried out by at least one of a humidifying process, a pressuring process and an ultraviolet light irradiating process.

The invention relates to the method for manufacturing the silicone resin reflective substrate, wherein the polymerization is carried out by injection molding in a die, or by press-molding in a die under heat and/or pressure.

The invention relates to the method for manufacturing the silicone resin reflective substrate, wherein a surface of the molding die is coated with a fluoro resin.

The invention relates to the method for manufacturing the silicone resin reflective substrate, wherein a crosslinking agent for three-dimensionally crosslinking the silicone resin, a reaction inhibitor which is deactivated or vaporized when heated, and a white inorganic filler powder which has a higher refractive index than that of the silicone resin, are dispersed in the polymerizable silicone resin base material to obtain the base material composition; and then the polymerization is initiated when heated.

The invention relates to a base material composition which is usable for forming the silicone resin reflective substrate, wherein the base material composition is a liquid-like or plastic-like composition containing a base material of a polymerizable silicone resin, a crosslinking agent for 3-dimensionally crosslinking the base material of the silicone resin and a white inorganic filler powder having a higher refractive index than that of the silicone resin.

The invention relates to the base material composition, wherein the base material composition contains a reaction inhibitor which is deactivated or vaporized when heated.

The invention relates to the base material composition, wherein the base material composition contains an organic solvent and/or a reactive diluent for adjusting viscosity.

In the silicone resin reflective substrate of the present invention, a white inorganic filler powder, whose refractive index is higher than the silicone resin, is dispersed and contained, so that reflection efficiency for a high intensity light from an LED light source having a broad emission wavelength from an approximately 340-500 nm to a near infrared light region such as a long wavelength of 1,000 nm, is excellent. In particular, reflection efficiency for a short wavelength light such as a blue light and a near-ultraviolet light, which has been difficult to reflect, can reflect efficiently. In addition, it is excellent in thermal conductivity, being excellent in heat radiation performance. In addition, this silicone resin reflective substrate is excellent in light shielding property, therefore causing no leak of light.

The reflective layer of the silicone resin reflective substrate is made of a three-dimensionally crosslinked silicone resin which has a resistance to deterioration and degradation. More preferably, a silicone resin having a non-cyclic dimethylsiloxy repeating unit is formed as a main unit in its main chain. Therefore, it has far more light and heat stability when compared to an epoxy resin and the like which tends to be yellowed under heat and light. As well as the reflective efficiency, it was excellent in light resistance over the time—especially in resistance to ultraviolet light or resistance to high intensity light—, durability such as heat resistance, antiweatherability and flame resistance and workability. It has a resistance to yellowing and degradation for a long period of time. In this silicone resin reflective substrate, the reflective layer maintains white color for a long period of time, being able to maintain its high light reflectivity.

Thanks to the siloxy repeating unit having heat and light resistance, this silicone resin reflective substrate has no yellowing and deterioration even if it contains white filler powder especially titanium oxide which has a high decomposing catalytic activity, and even if it is exposed to a high intensity light-emitting diode, direct daylight and high temperature for a long time.

This silicone resin reflective substrate has a white inorganic filler powder, fluorescent substance, etc. which are dispersed in the reflective layer and are exposed to the air from the layer's surface, so that the reflectance is improved. Therefore its irradiation efficiency is improved when the reflective substrates are mounted on a luminescent (light emitting) device.

In particular, in a case where a silicone rubber base material such as a fluorine-modified silicone rubber, dimethylsilicone rubber, etc., which has a relatively low refractive index, is used, a difference in the refractive indexes between the white inorganic filler powder or fluorescent substance and the low refractive index silicone rubber base material which contacts the surface of the white inorganic filler powder or the fluorescent substance becomes large. Accordingly, light reflection is carried out efficiently. On the exposed surfaces of the white inorganic filler powder or the fluorescent substance, light is reflected and emitted efficiently, being desirable.

The surface of the reflective layer of the silicone resin reflective substrate may be a mirror surface to reflect light. In the case the surface of the reflective layer is a non-specular surface such as a concavo-convex-like, a prism-like, or a pearskin-like surface treated by using sandblast, etc., and the size of the non-specular surface is a nanometer to micrometer order, for example, 100 nm-10 μm, the light reflected on the specular surface tends to be diffused. Accordingly, nonunifomity of reflectivity is improved.

The silicone resin in this silicone resin reflective substrate is 3-dimensionally crosslinked through oxygen atom and/or crosslinkable functional group. Therefore, the reflective layer having the silicone resin can be formed into a film-like, 3-dimension-like or plate-like shape. In addition, the liquid-type or grease-type or plastic-type base material composition which contains the white inorganic filler powder and polymerisable silicone resin base material is coated in the thickness of 2,000 μm at maximum, and then 3-dimensionally crosslinked to form the reflective layer. Therefore, the reflective layer of the silicone resin reflective substrate can be freely formed into any shape according to the shape of the wiring substrate, the assembly or the package case of the optical device. As therefore it can be used widely. In addition, the base material composition can be used as adhesives, as well as reflective material, to combine the package case with the support body.

By arbitrarily coordinating mole numbers of 1-4 Si atoms which are used in 3-dimensionally crosslinking reaction in the silicone resin, and bonding modes such as ether bonding through oxygen atom, or a condensation or addition type bonding through crosslinkable functional group, the polymerisable silicone resin base material composition can be made into high viscous so that the base material composition can be used for thick coating. In addition, in the silicone resin, when the content of a volatile residual low molecular weight siloxane, which tends to repel a melted metal due to a low surface tension, is low, wiring workability such as soldering between a metal and conductive wire of such as light-emitting diodes, can be carried out easily.

Furthermore, the surface of this silicone resin reflective substrate is treated by physical grinding•roughening, by die molding using a scabrous surface or by surface treatment such as chemical etching, so that the surface becomes a roughened surface or convexo-concave surface. The surface roughness itself becomes in the range of nanometer to micrometer level. Light is diffusively reflected on the surface, and reflective efficiency is improved by several % (from about 90% to about 97-98%). This is because reflective white inorganic filler powder is exposed to the air. Further in the surface-treated silicone resin reflective substrate, when the exposed white inorganic filler powder is treated with silane coupling agent, adhesion between a metal and the treated substrate is improved, due to improvement of anchor effect caused from the surface roughness and also chemical bonding caused from silicone coupling agent. Even on the poor adhesive silicone resin, adhesion of metal film in metal plating is improved. Further, physical strength of the reflective layers itself is also improved. And the surface roughening also contributes to prevent dusts or foreign matter from attaching to the surface of the reflective layer.

In particular, in the silicone resin reflective substrate, when the reflective layer that covers the circuit substrate (or wiring substrate) on which a conductive pattern is attached, is ground, thereby, the conductive pattern is exposed to the air, and reflective efficiency becomes very high because a portion other than the conductive pattern on the circuit substrate is used as the reflective layer. Grinding may be a mirror polishing, a rough polishing or a machine polishing.

This silicone resin reflective substrate of the present invention can be manufactured by a simple process, surely, homogeneously, in high quality, on a massive scale, at low cost and a high rate of production.

This silicone resin reflective substrates can be used generally not only for a light emitting devices such as light-emitting diodes, but also for reflective substrates in various fields such as wiring substrates for various optical devices, photoelectric conversion elements of solar cells devices, electric members such as package cases, backseats and other lighting apparatuses.

According to the manufacturing method for the silicone resin reflective substrate of the present invention, coating up to 2,000 μm thick can be made without dripping of the high viscous polymerizable silicone resin material composition, regardless of material, shape, surface roughness, smoothness, width, hardness, thickness, etc. of the support body. Therefore, using injection molding (LIMS), stamp forming with pressing molding die•roller, coating process such as spraying and coating, a reflective layer having a thin thickness film of from 1-10 μm to a thick film or plate having a thickness of 2,000 μm or 3-dimensional-like shape can be formed, through polymerization of the silicone resin 3-dimensionally. Reflective layers can be produced using this base material composition. The silicone resin base material composition may be coated directly or after adjustment of the viscosity of the composition. Coating can be carried out using conventional coating method such as screen printing, bar coating, roll coating, reverse coating, gravure coating, air knife coating, spray coating, curtain coating, etc. For a thin film coating, a high precision offset coating, multistage roll coating, etc. which are well known techniques, can be used. When thick coating is adopted, single coating can be adopted to get an initially designed thickness, so that there is no need of additional coating and drying.

The die used here is preferably coated with a mold release agent, for example, a fluoro resin such as polytetrafluoroethylene.

Even when the polymerizable silicone resin base material composition is appropriately diluted by solvent, lowering in the viscosity, which is observed for epoxy resins when heated, can not be seen. Accordingly, the shape of the composition is cured as it is without causing deformation, being able to obtain the originally intended shape and thickness of the reflective layer.

Such polymerization can be easily accomplished under heating, humidifying, ultraviolet irradiating method, or if needed pressure is applied. A reflective layer excellent in adhesion property can be prepared. Therefore, this production method is excellent in processing characteristics, production efficiency, versatility, etc., because any reflective base materials having any shapes can be manufactured easily and massively.

In the manufacturing method of the silicone resin reflective substrate, fluoro resin is vapor deposited or spray printed in a thickness of approximately 0.1 mm on a molding die so that mold release can be performed easily. Therefore reflective layer having a desired shape and surface roughness can be manufactured with accuracy and high reproducibility, thereby an yield rate and production efficiency can be further improved.

In the manufacturing method for the silicone resin reflective substrate, the silicone resin base material composition containing a polymerizable silicone resin base material, a 3-dimensional crosslinking agent, a reaction inhibitor which is deactivated and volatilized when heated and white inorganic filler, can be stored stably at room temperature for a long period of time. It does not polymerize until heat is not given, but when it is heated, the polymerization certainly initiates and completes for a short period of time, so that production efficiency can be improved.

BRIEF DESCRIPTION OF DRAWINGS

FIG. 1 is a schematic sectional view showing a luminescent (light emitting) device 1 with silicone resin reflective substrates 10•20, of the present invention.

FIG. 2 is a schematic sectional view showing a luminescent device with another silicone resin reflective substrate 21, of the present invention.

FIG. 3 is a schematic sectional view showing a manufacturing process of another silicone resin reflective substrate 10 using a die molding method, and a manufacturing process of luminescent device 1 with reflective substrate 10, of the present invention.

DESCRIPTION OF THE REFERENCE NUMERALS

Figure 4:
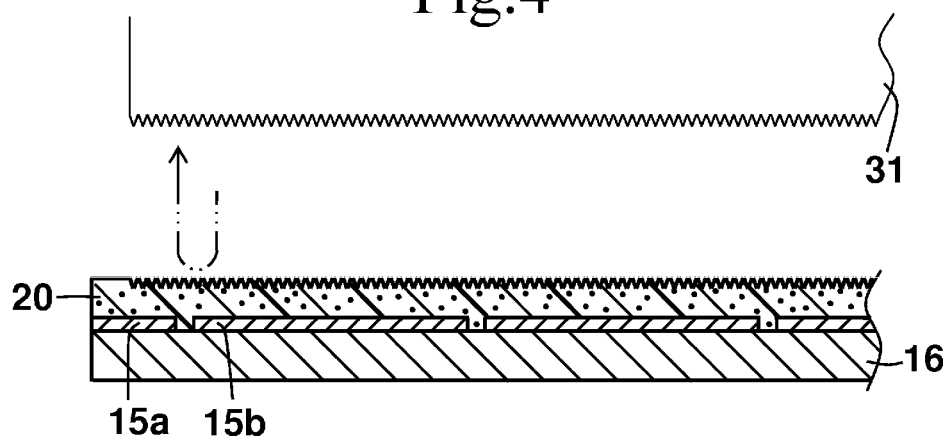
FIG. 4 is a schematic sectional view of the manufacturing process of another silicone resin reflective substrate 20 using a die molding method, of the present invention.

1: luminescent (light emitting) device
2: solar cell assembly

10: package case made of a silicone resin reflective substrate
11: inner wall
12a•12b: white inorganic filler powder
13: light-emitting diode
14a•14b: lead wire
15a•15b: copper film
16: support body
17: solar cell element
17a: p-type silicone semiconductor
17b: n-type silicone semiconductor
18a•18b: copper film
20•21: base plate of silicone resin reflective substrate
22: glass cloth
31: molding die
32: hole
33: dicing saw
34: coating (spraying) nozzle
35: roller
36: grinder

MODE FOR CARRYING OUT THE INVENTION

Preferred embodiments of the present invention will be precisely described below with referring to FIGS. 1-10, but the scope of the present invention should not be limited to these embodiments.

At first, one of a preferred embodiment of the silicone resin reflective substrate will be precisely explained with referring to FIG. 1.

As shown in FIG. 1, the silicone resin reflective substrate of the present invention is mounted onto lighting device 1 or a kind of light emitting device, and is used in the wiring substrate to which silicone resin reflective substrate 20 having copper foils (15a•15b) or a wiring pattern to which light emitting diode 13 or a light emitting element is attached. A silicone resin reflective substrate is also used in a package case 10 surrounding the light emitting element 13.

In silicone resin reflective substrates 10•20,—a package case or wiring face plate—, has a reflective layer containing a silicone resin and white inorganic filler powder which is dispersed in the silicone resin. Reflective substrates 10•20 are formed into film-like, 3-dimension-like or plate like shape.

On silicone resin reflective substrates 10•20, silicone resin is exposed to the air, and that a portion of white inorganic filler powder 12a•12b—for example an anatase-type titanium oxide—is exposed to the air. Silicone resin reflective substrates 10•20 exhibit a white color and has excellent light shadowing properties, so that light is not leaked out. Furthermore, at this portion, light reflectance over the wavelength from a shorter wavelength (380-420 nm) to a longer (near infrared) wavelength is extremely high. Silicone resin reflective substrates 10•20 have a high light reflectance, and maintain white color without yellowing when they are exposed to a high intensity light for a long period of time. It has excellent physical properties, light and heat resistance and antiweatherability, being excellent in durability.

Silicone resin reflective substrates 10•20 contain a silicone resin having a noncyclic dimethylsiloxy repeating unit [—Si(—CH$_3$)$_2$—O—] as a main component in its main chain,—for example a silicone resin which contains polydimethylsilicone having a refractive index of 1.41—, or a silicone resin whose main chain is polydimethylsiloxane which is 3-dimensionally crosslinked with each other, and white inorganic filler powder 12a•12b comprising titanium oxide (the refractive index of titanium oxide is higher than that of the silicone resin).

Figure 6:
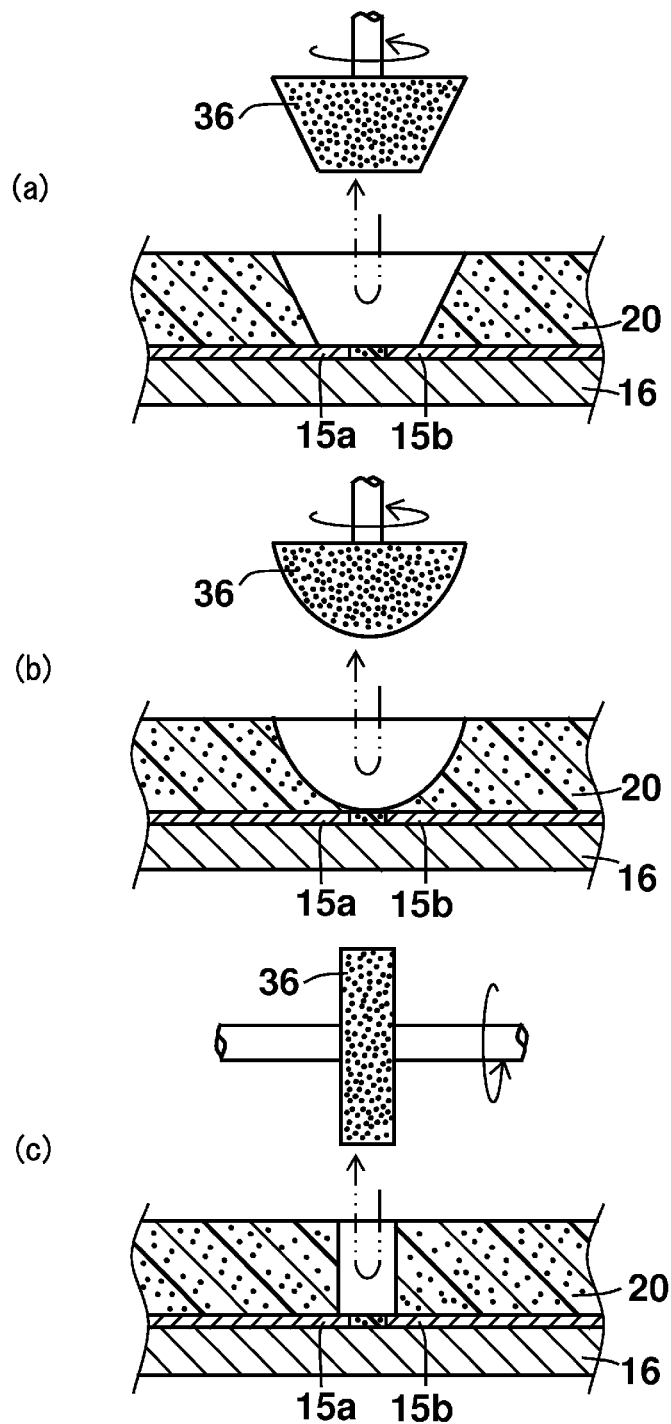
FIG. 6 is a schematic sectional view showing a manufacturing process of another silicone resin reflective substrate 20 using a grinding method, of the present invention.
Figure 7:
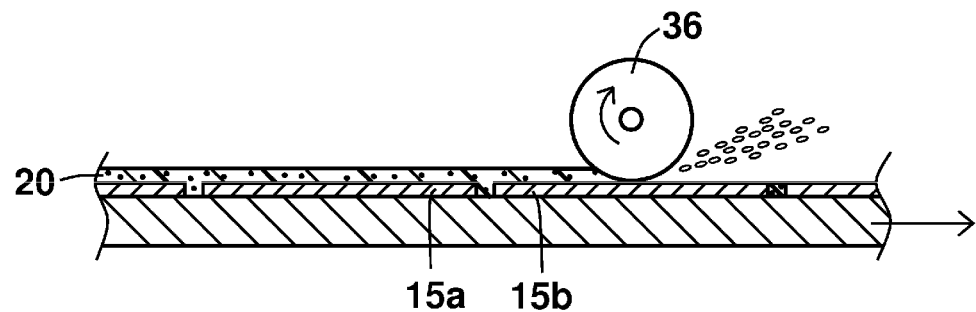
FIG. 7 is a schematic sectional view showing a manufacturing process of another silicone resin reflective substrate 20 using a grinding method, of the present invention.

The silicone resin which contains a noncyclic dimethylsiloxy repeating unit as a main component in its main chain is not specifically limited. A hard silicone resin, soft silicone resin, silicone rubber, etc. can be included. Any silicone resin can be used depending on the intended use. For example, when it is used for a 3-dimensional casing, hard or soft silicone resin can be preferably used from the viewpoint of shape stability. When a support body is made of flexible material, silicone rubber can be preferably used. In FIGS. 6 and 7, a grinding process is used, and a hard silicone resin or a soft silicone resin can be preferably used because it can be processed accurately.

As for hardness of the reflective layer which contains a silicone resin and a white inorganic filler powder, generally when Shore A hardness (measured by JIS A hardness tester), is not more than 90 or Shore D hardness is not more than 30 (measured by JIS D hardness tester), the reflective layer is felt like rubber. In the present invention, when Shore D hardness is not higher than 50, the reflectance layer is recognized as a rubber. When Shore D hardness is in the range of 40-60, the resin reflective layer is felt like soft resin. On the other hand, when Shore D hardness is over 60, it does not feel rubbery, reflective layer can be felt like a high hardness resin.

Such silicone resin is 3-dimensionally cross linked between different Si atoms which exist in the repeating unit in the same main chain or another repeating unit in another main chain, through oxygen atom and/or crosslinkable functional group. The main chain is made of poly(dimethylsiloxane) structure. Other poly(dialkylsiloxane) structure, poly(diarylsiloxane) structure such as poly(diphenylsiloxane) or poly(crosslinkable functional group-derived crosslinking-group-containing siloxane) structure can be partially contained.

Specifically, following substances can be exemplified as the silicone resin. These substances have a 3-dimensional crosslinking structure and are hard or soft resins, and exhibit non elasticity or rubber elasticity.

As the silicone resin base material compositions which are used for forming the silicone resin reflective substrate, various curing types such as an additional reaction curing type, an organic peroxide curing type, a condensation curing type, etc. can be exemplified. However, additional reaction curing type is preferably used in light of improvement of a production rate. In addition, the case of additional-reaction-curing type has a small shrinkage ratio at its curing, so that wrinkles generated at curing process can be reduced, being desirable.

For example, the silicone resin which contains a non cyclic dimethylsiloxy repeating unit as its main component in the silicone resin, specifically, is a polymer having a polymerization degree of approximately 5,000 to 10,000 and an average molecular weight of 400,000 to 800,000. Such silicone resin may be polydimethylsiloxane comprising only of dimethylsiloxy repeating unit [—Si(—CH$_3$)$_2$—O—] (as it is called a dimethyl type silicone) or may be what is called a methylvinyl type silicone or a methylphenylvinyl type silicone which contains [—Si(—CH$_3$)$_2$—O—] and [—Si(—CH$_3$)(—CH=CH$_2$)—O—]. It may further contain a unit of [—Si(—CH$_3$)(—C$_6$H$_5$)—O—].

As a main component in the silicone resin base material in such silicone resin base material composition, an organo polysiloxane having a single or a plurality of alkenyl groups in its molecule, organohydrogen polysiloxane having a single or a plurality of silicone-atom-bonded hydrogen atoms in its molecule and a platinum group metal-type catalyst-containing polysiloxane, etc. can be exemplified. In order to prevent a decrease in volume resistivity caused by inclusion of metal powder and in order to surely develop non-conductivity, 0.2% by mass or over of fine powder silica may be added against organo polysiloxane. Further in order to improve adhesiveness on the support body, the silicone resin base material composition may contain an adhesiveness improving component having a reactive functional group such as an epoxy group, an alkoxysilyl group, a carbonyl group, a phenyl group, etc.

The silicone resin used for forming the present reflective substrate may be 3-dimensionally crosslinked using other crosslinkable functional group. The Si group which exists in the 3-dimensionally crosslinked silicone resin exist in an alkyloxysilyl group or dialkyloxysilyl group, vinylsilyl group or divinylsilyl group, hydrosilyl group or dihydrosilyl group. A plurality of these groups may exist in the silicone resin. Through these functional groups, the main chains of the noncyclic dimethylsiloxy repeating units are 3-dimensionally crosslinked with each other. The main chains of the silicone resin may be 3-dimensionally crosslinked with each other directly by the crosslinkable functionable group and/or indirectly through silane coupling agent. The main chains are crosslinked between crosslinkable functional groups with each other or between a crosslinkable functional group and a silane coupling agent; in other words, the main chains are crosslinked by condensation reaction (dealcohol reaction) between alkyloxysilyl groups or between dialkyloxysilyl groups, or the main chains are crosslinked, between vinylsilyl group divinylsilyl group and hydrosilyl group or dihydrosilyl group, by way of solvent-free addition reaction by heating or light irradiation in the presence of a platinum catalyst such as a platinum complex. Among them, an additionally crosslinked silicone resin is preferably used. The silicone resin may have a repeating unit of dimethylsiloxy group ($-Si(CH_3)_2-O-$) and diphenylsiloxy group ($-Si(C_6H_5)_2-O-$) as a main chain. The silicone resin preferably has a repeating unit of dimethylsiloxy group, and is more preferably crosslinked by alkyloxysilyl group, dialkyloxysilyl group, vinyl-silyl group, divinylsylyl group, hydrosilyl group, dihydrosilyl group.

The 3-dimensionally crosslinked silicone resin can be obtained, for example, by 3-dimensionally crosslinking a polymerizable silicone resin base material. More specifically, in a case where additional reaction curing type silicone resin is used as a base material, a crosslinked silicone resin which can be obtained by heat curing is preferably used. For example, a composition comprising organopolysiloxane as a base polymer, organohydrogen polysiloxane and a heavy metal type catalyser such as a platinum type catalyser are exemplified.

As the organopolysiloxane, following average unit formula can be exemplified $$R^1_a SiO_{(4-a)/2}$$

(in the formula; $R^1$ is an unsubstituted or substituted monovalent hydrocarbon, preferably carbon number 1-10, more preferably 1-8, a is 0.8-2 more preferably 1-1.8 positive member)

In the formula, R is an alkyl group such as methyl group, ethyl group, propyl group, butyl group; alkenyl group such as vinyl group, allyl group, butenyl group; aryl group such as phenyl group, tolyl group; aralkyl group such as benzil group etc. a halogen atom substituted hydrocarbon group such as a chloromethyl group, chloropropyl group, 3,3,3-trifluoro-propyl group, etc. a portion or all of the hydrogen atom which is or are bonded to a carbon atom is/are substituted by halogen atom; a cyano group substituted hydrocarbon group such as a cyano group substituted 2-cyanoethyl group etc.; $R^1$ may be the same or different from each other; $R^1$ is preferably a methyl group, especially the methyl group of dimethylsiloxy group which exists as a main component is preferable in terms of development of reflective properties, heat stability and durability.

As $R^1$, a group containing an alkenyl group with a carbon number of 2-8 such as vinyl group is preferably used. In particular, the alkenyl group is contained in a ratio of 1-20 mole % in the whole R is more preferably used. Further polysiloxane having two or more alkenyl group in one polysiloxane molecule is more preferably used. As such organopolysiloxane, for example, diorganopolysiloxane having alkenyl group on its main chain or at the end of the molecule such as dimethylpolysiloxane or dimethylsiloxane-methylphenyl siloxane copolymer etc. having alkenyl group such as vinyl group, etc., which is placed at the end of the molecule or on its main chain, is exemplified. In particular, liquid type polymers at the room temperature are preferably used.

More specifically, such alkenyl group-containing organopolysiloxane can be represented by the following chemical formula.

$$R^2-[Si(R^3)_2-O]_b-[Si(R^3)(R^4)-O]_c-R^2$$

This polymer may be a block copolymer or a random copolymer.

(in the formula, $R^2$ is the same or different from each other, $R^2$ is a saturated hydrocarbon group such as methyl group as shown in the $R^1$ or aromatic hydrocarbon group such as phenyl group etc. or an alkenyl group exemplified in the $R^1$; $R^3$ is the same or different from each other, $R^3$ is a saturated hydrocarbon group as shown in the $R^1$ or an aromatic hydrocarbon group; $R^4$ is an alkenyl group exemplified in the $R^1$; b and c are positive number)

Such alkenyl group-containing organopolysiloxane can be a linear polymer or a polymer having a branched structure at a part of the molecular structure or can be a circular structure. In light of physical properties such as mechanical strength, elasticity, repeating bending performance, etc. of reflective substrate made of the 3-dimensional crosslinked silicone resin, linear-chain type diorganopolysiloxane is preferably used. The repeating number of the repeating unit of the alkenyl group-containing organopolysiloxane is preferably in the range of 10-10,000. Preferable viscosity of such alkenyl group-containing diorganopolysiloxane is in the range of approximately 10-1,000,000 St at 25° C.

As an organohydrogenpolysiloxane, linear, branched, cyclic or 3-dimensional type network molecule can be used. A single or a plurality or preferably three or more functional groups can be used (that is, the number of hydrogen atom which is bonded to silicone atom (Si—H group) per one molecule). Any polymer can be used if Si—H group is located at the end portion and/or on the main chain. For example, methylhydrogenpolysiloxane, methylphenylhydrogenpolysiloxane, etc. can be exemplified. In particular, a liquid type one at room temperature is preferably used. As for catalyser, organic metal compound such as platinum, platinum compound, dibutyltindiacetate, dibutyltindilaurate, etc. or an aliphatic acid metal salt such as tin octoate can be exemplified. Kinds and amounts of these organohydrogenpolysiloxane and catalyser can be determined arbitrarily.

As for the organohydrogenpolysiloxane, following average unit formula can be exemplified.

$$H_d R^5_e SiO_{(4-d-e)/2}$$

(in the formula, $R^5$ is a group exemplified in $R^1$, especially saturated hydrocarbon group; d and e are limited as follows 0<d<2, 0.8≤e≤2) specifically, as an example of the organohydrogenpolysiloxane, a siloxane oligomer having Si—H group at its end portion such as 1, 1, 3, 3-teteramethyl disiloxane, 1, 3, 5, 7-tetramethyl-tetracyclosiloxane, 1, 3, 5, 7, 8-pentamethylpenta cyclosiloxane; a hydrogen polysiloxane of a homopolymer or a copolymer having Si—H group on its main chain, such as trimethylsiloxy end group-containing methyl hydrogen polysiloxane, trimethylsiloxy end group-containing dimethylsiloxane•methylhydrogen syloxane copolymer, silanol end group-containing methyl hydrogen polysiloxane, silanol end group-containing dimethylsiloxane•methylhydrogen siloxane copolymer, dimethylhydrogensiloxy end group-containing methylhydrogen polysiloxane, dimethylhydrogensiloxy end group-containing dimethylsiloxane•methylhydrogne siloxane copolymer. Such organohydrogen polysiloxane contains $R^5{}_2$(H)SiO$_{1/2}$ unit and SiO$_{4/2}$ unit and may further contains $R^5{}_3$SiO$_{1/2}$ unit, $R^5{}_2$Si$_{2/2}$ unit, $R^5$(H)SiO$_{2/2}$ unit, (H)SiO$_{3/2}$ unit or $R^5$SiO$_{3/2}$ unit.

More specifically, a cyclic type —[SiH(CH$_3$)]$_4$—, H—[Si(CH$_3$)$_2$—O]—[Si(CH$_3$)$_2$—O]$_f$[Si(CH$_3$)$_2$]—H (here, f is 0-200), (CH$_3$)$_3$SiO—[Si(CH$_3$)$_2$—O]$_g$—OSi(CH$_3$)$_3$ (here, g is 0-200), (CH$_3$)$_3$SiO—[Si(CH$_3$)$_2$—O]$_h$—[Si(CH$_3$)$_2$—O]$_i$—Osi(CH$_3$)$_3$ (here his 0-200, i is 1-100), can be exemplified.

This organohydrogenpolysiloxane can be prepared, for example, by cohydrolysis reaction of chlorosilane compound such as $R^5{}_3$SiCl and $R^5{}_2$SiCl$_2$ (here, $R^5$ is the same as explained before), or can be prepared by cohydrolysis of these chlorosilane compound and another chlorosilane compound such as $R^5{}_3$SiCl or $R^5{}_2$SiCl$_2$ (here, $R^5$ is the same as explained before), or can be prepared by further equilibration.

This organohydrogenpolysiloxane is used together with alkenyl group-containing organopolysiloxane. 0.5 to 4 mol equivalent of SiH group of organohydrogenpolysiloxane is preferably added against 1 mol equivalent of alkenyl group of alkenyl group-containing organopolysiloxane.

Platinum group metal catalyst which is used for platinum group metal catalyst-containing polysiloxane is used as a hydrosilylation reaction catalyst to promote an addition reaction between the alkenyl group of alkenyl group-containing organopolysiloxane and the SiH group of organohydrogen polysiloxane. As this catalyst, various metal catalysts can be exemplified. Specifically, platinum group metal such as platinum, platinum black, rhodium, paradium; platinum chloride complex salt such as H$_2$PtCl$_4$.mH$_2$O, H$_2$PtCl$_6$.mH$_2$O, NaHPtCl$_6$.mH$_2$O, KHPtCl$_6$.mH$_2$O, Na$_2$PtCl$_6$.mH$_2$O, K$_2$PtCl$_4$.mH$_2$O, PtCl$_4$.mH$_2$O, PtCl$_2$, Na$_2$HPtCl$_4$.mH$_2$O (here, m is 0-6); alcohol modified chloroplatinic acid; chloroplatinic acid-olefin complex; support metal (platinum group metal such as platinum, palladium, etc. is supported on alumina, silica, carbon, etc.); rhodium-olefin complex; Wilkinson catalyst such as chlorotris (triphenylphosfine) rhodium; complex between chloroplatinum, chloroplatinum acid or salt and vinyl group-containing linear or cyclic siloxane. A platinum group metal catalyst is coexisted with alkenyl group-containing organo polysiloxane and organohydrogenpolysiloxane.

The catalyst is used as it is or in the form of supported catalyst. The amount of catalyst against the polysiloxane is approximately 0.1-500 ppm.

Preferably the silicone resin is an arbitrary combination of, for example, triorganosiloxane unit (R$_3$SiO$_{1/2}$ unit: M unit), diorganosiloxy unit (R$_2$SiO unit: D unit), monoorganosiloxy unit (RSiO$_{3/2}$ unit: T unit), siloxy unit (SiO$_2$ unit: Q unit) (however, the organo group R is the same or different, and is a group derived from alkyl group such as methyl group, phenyl group or a crosslinkable functional group such as vinyl group). As silicone resin, an arbitrary combined resin such as a 3-dimensionally crosslinked MQ resin, MDQ resin, MTQ resin, MDTQ resin, TD resin, TQ resin, TDQ resin.

In the silicone resin, a Si atom of a repeating unit is bonded to another Si atom of another repeating unit through oxygen atom or a crosslinkable functional group, thereby forming a 3-dimensional crosslinking.

The silicone resin reflective substrate is mounted on an electric component. Low molecular weight syloxane which is contained in the silicone resin (they may cause an electric contact problem and a cloud or tarnish) such as a cyclic low molecular weight siloxane having a siloxy group repeating unit of 4-10 (D4-D10). These low molecular weight siloxanes should be removed to a level of 300 ppm, preferably less than 50 ppm. To avoid such problems, commercially available polymerizable silicone resin base material with decreased content of low molecular weight siloxane is preferably used. Alternatively, heat treatment such as heat oven treatment (heat treatment for example at 200° C. for 4 hours), heating under vacuum (for example at 200° C. for 2 hours heating under vacuum), etc. are carried out to obtain a silicone resin base material with low content of such low molecular weight silicone resin. Further, in these treatments, low molecular weight silicone can be removed using ultrasonic solvent extraction method from molded articles. From the silicone resin base material, low molecular weight siloxane can be removed to some extent, but when low molecular weight siloxane is removed from the molding articles, contents of low molecular weight silicone in the molding articles can be preferably reduced.

As silicone resin base material composition, like ordinary curable silicone resin composition, two-component type one can be used. Liquid in two-component type is blended and cured. However one-component type is preferably used in light of workability. This silicone resin base material composition can be cured under ordinary conditions, for example, it can be crosslinked and cured under heating or ultraviolet irradiation to develop a hard or soft and nonelastic or elastic rubbery article.

These silicone resin reflective substrates 10•20 are formed on an untreated support body. At the time of curing by the 3-dimensional crosslinking of the polymerizable silicone resin base material, the silicone resin has an excellent cohesiveness•adhesiveness so that bonding strength between the support and the reflective layer becomes high.

Surface treatment of the support body is not indispensable, however prior to coating of the support body with the silicone resin base material composition, the surface of the support body to be coated is treated by corona discharge-, plasma irradiation-, ultraviolet irradiation-, frame processing-, itro-treatment or surface-roughening treatment, the reflective substrate coheres and adheres more tightly to the treated surface of the support body. These corona discharge-, plasma irradiation-, ultraviolet irradiation-, frame processing-, itro-treatments are preferably carried out just before the application of the polymerizable silicone resin base material composition.

These supports are preferably bonded tightly to the reflective material layers through corona discharge-, plasma irradiation-, ultraviolet irradiation-, frame processing-, itro-treatment. The support body may be surface treated with the reactive group-containing polysiloxane solution.

On the surface of the support body and the reflective material layer, a functional silane compound such as a silane coupling agent may be coated to obtain a further stronger adhesiveness. As such functional silane compound, polysiloxane which contains a group highly reactive with OH group can be exemplified.

As such reactive group-containing polysiloxane, a compound represented by the following formula is exemplified.

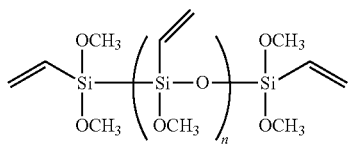

(1)

(In formula (1); n is the number of 3-4, and at least one reactive group, —OCH$_3$, reacts with a functional group, for example —OH on the surface of the reflective layer and the metal foil layer) In this compound, the repeating units may be a block copolymer or a random copolymer. In order to improve reactivity, immersion into or application of a solution of vinylalkoxysiloxane homopolymer such as vinylmethoxysiloxane homopolymer, immersion into a platinum catalyst suspending solution so as to make the vinyl group of the active silyl group hold the platinum catalyst.

Bending strength and hardness of the silicone resin reflective substrate with or without a silane coupling treatment is shown in Table 1.

TABLE 1

| | With or without silane coupling treatment | |
|---|---|---|
| | With silane coupling treatment | Without silane coupling treatment |
| Bending strength (MPa) | 20 | 16.9 |
| Hardness (Shore D) | 66 | 65 |

As shown in Table 1, physical strength of the silicone resin reflective substrate is improved.

The silicone resin base material composition which contains white inorganic filler powder can be prepared by arbitrarily adjusting the adding amount of white inorganic filler powder, silicone rubber powder, organic solvent and reactive diluent. Depending on the intended use, liquid type-, grease type- or plastic type-composition, which is defined as a plasticity like a plasticity number, can be prepared by adjusting the plasticity of the composition. For example, in a case where a resist ink is applied using a spraying, dispensing or screen printing method, the ink preferably has a viscosity of 0.5-500 Pa·s, more preferably 10-200 Pa·s as the liquid type composition. In a case where the composition is molded using heat pressing method, the composition is preferably adjusted to have a plasticity number of 100-500 mm/100 (measured by International Standard ISO 7323) which can be used as a millable type or plastic type composition.

In a case where the silicone rubber powder and white inorganic filler are used, a preferable additive amount is 3-400 parts by mass against 100 parts by mass of the silicone resin base material, preferably 50-300 parts by mass. When the adding amount of the white inorganic filler is less than that value, it is difficult to achieve a sufficient reflectance. On the other hand, the adding amount of the white inorganic filler is more than that amount, processability is damaged. When the silicone resin base material composition is applied in a thin layer, reflectance increases with increasing of the amount of the white inorganic filler. On the contrary, when it is coated in a thick layer, sufficient reflectance can be achieved even if the adding amount of the white inorganic filler is low. The silicone rubber powder is added within the above mentioned range, and is added together with white inorganic filler.

Organic solvent may be added in order to improve storage stability and coating processability, to control coating amount and to adjust the viscosity. When organic solvent is used, the adding amount is preferably in the range of 100-10,000 parts by mass against 100 parts by mass of silicone resin base material. When the adding amount of the organic solvent is less than the range, the composition becomes sticky and causes clogging, declining productivity. On the other hand, when the organic solvent is used more than the range, thick coating becomes impossible and sufficient reflectance can not be achieved by single a coating. The amount of the organic solvents is used arbitrarily in accordance with reflectance, film thickness, and viscosity. The organic solvent is selected so as not chemically react with the silicone resin base material, crosslinking agent and reaction inhibitor. Specifically, toluene, xylene, ethylacetate, acetone, methylethylketone, hexane, etc. can be exemplified. At the time of adjusting the viscosity with an organic solvent, filler density of the white inorganic filler powder becomes relatively low. However, after curing and vaporizing of organic solvent, the filler density becomes back to a level as observed before the viscosity adjustment. Therefore, high density printing can be realized even though coating is made in a thin thickness.

Reactive diluent is used to mainly adjust the viscosity of one-component type adhesive. It is not volatile as different from organic solvent and is cured directly together with the silicone resin. As a reactive diluent, for example, a liquid type reactive diluent for silicone resin (produced by Momentive Performance Materials Inc., trade name; ME 91) can be exemplified. The amount of reactive diluent is in the range of 0.1-30 parts by mass against 100 parts by mass of the silicone resin base material, preferably 1-20 parts by mass. If the amount of diluent is lower than this range, viscosity cannot be adjusted. On the contrary, if overused, physical properties of the silicone resin decrease. Reactive diluent is cured to be converted into silicone resin. Therefore, there is no reduction in thickness of the reflective layer after curing. Therefore, reactive diluent is conveniently used to form a thick reflective layer.

The amount of organic solvent and reactive diluent is arbitrarily adjusted according to the thickness of the reflective layer to be formed and according to a coating method such as printing method, etc.

A liquid-like, a grease-like or a plastic-like base material composition which contains polymerizable silicone resin base material and white inorganic filler powder, may further contains a crosslinking agent, which crosslinks the silicone resin three-dimensionally. Such crosslinking agent may include a hydrogenorganopolysiloxane, platinum group metal catalyst-containing polysiloxane, a peroxide-type cross-linking agent, etc.

A liquid-like, a grease-like or a plastic-like base material composition which contains polymerizable silicone resin base material and white inorganic filler powder, may further contains a reaction inhibitor which is deactivated or vaporized when heated. To improve the storage stability of the base material composition, this reaction inhibitor inhibits curing reaction during storage of this base material composition, for example, inhibits an additional reaction of alkenyl group-containing organopolysiloxane organohydrogen polysiloxane or a silicone resin base material without decrease in the activity of the catalyst which is added if needed. As the reaction inhibitor, methylvinylcyclotetrasiloxanes; acetylenealcoholes such as 3-methyl-1-butyne-3-ol, 3,5-dimethyl-1-hexine-3-ol, 3-methyl-1-pentene-3-ol, phenylbutinol, etc.; acethylene compounds such as 3-methyl-3-pentene-1-yn, 3,5-dimethyl-1-hexine-3-yn, etc.; siloxane modified acethylenealcoholes which are obtained by reacting these previously mentioned acetylene compounds with alkoxysilane, alkoxysiloxane, hydrogensilane or hydrogensiloxane; nitrogen-containing organic compounds such as benzotriazole; organic phosphorous compounds; oxime compounds; organic chromium compounds, etc. can be exemplified.

As described above, this base material composition does not initiate the 3-dimensional crosslinking reaction unless it is not heated. Therefore, it can be stored safely for a long period of time. On the other hand, when heated, 3-dimensional crosslinking reaction is initiated quickly and then completed rapidly, forming a reflective layer. If a liquid-type, a grease-type or a plastic-type composition is diluted by organic solvent, uniform coated films can be produced using coating method at the time the organic solvent is vaporized as well as the organic solvent is not vaporized, obtaining a uniform coated films.

The amount of the crosslinking agent or the reaction inhibitor is added preferably in a ratio of 0.01-10 parts by mass against 100 parts by mass of the polymerizable silicone resin base material.

These base material compositions can be used as a resist. This base material is a thermoset type resist. For example, when heated to 100° C. or over, curing occurs. At the time of curing, if reaction inhibitor is selected arbitrarily, curing temperature and curing onset temperature can be controlled arbitrarily.

In a case where the base material composition is an addition reaction-type composition, this composition may contain, besides its main component, a crosslinking agent, platinum catalyst, reaction inhibitor, reinforcing agent and various additives according to its intended use.

The base material composition may contain an adhesive component. As this adhesive component, a silane compound or siloxane compound having a reactive functional group such as a vinyl group, a phenyl group, an alkoxy group, an epoxy ring-containing group such as 2, 3-epoxypropyl group ($C_2H_3O$—), a reactive functional group such as a methacryloyl group, etc. can be exemplified. As such adhesive component, specifically, $CH_2$=$CHSi(OCH_3)_3$, $C_6H_5Si(OCH_3)_3$, $CH_2$=$CHSi(OCH_2H_4OCH_3)_3$, $C_2H_3O$—$CH_2O(CH_2)_3Si(OCH_3)_3$, $C_2H_3O$—$CH_2O(CH_2)_3SiCH_3(OCH_3)_2$, $CH_2$=$CH$—$CO$—$O(CH_2)_3SiCH_3(OCH_3)_2$, $CH_2$=$CCH_3$—$CO$—$O(CH_2)_3SiCH_3(OCH_3)_2$, 2-(2, 3-epoxypropyloxy propyl)-2, 4, 6, 8-tetrametyl-cyclotetrasiloxane, 2-(2, 3-epoxypropyloxypropyl)-2, 4, 6, 8-tetramethyl-6-(trimethoxysilylethyl) cyclotetrasiloxane, etc. can be exemplified.

The silicone resin reflective substrate formed from this composition preferably contains 3-400 parts by mass of white inorganic filler powder 12a•12b against 100 parts by mass of silicone resin. Preferable average diameter of the white inorganic filler powder is in the range of 0.1-10 μm.

As the white inorganic filler powder 12a•12b, for example, titanium oxide, more preferably anatase-type titanium oxide or rutile-type titanium oxide are exemplified. Together with or as an alternative of the titanium oxide, an inorganic white pigment such as alumina, barium sulfate, magnesia, aluminum nitride, boron nitride (hexagonal, cubical), barium titanate, kaolin, silica, talc, powdered mica, powdered glass, powdered aluminum, powdered nickel, calcium carbonate may be used alone or in combination.

Even if only an inorganic white pigment such as alumina or barium sulfate is used in a maximum dispersible amount in the silicone resin, there is still a fear of leak of light, but a titanium oxide, especially a rutile-type titanium oxide having a high hiding power is preferably used together with the inorganic white pigment, because leak of light can be prevented.

To improve heat conductivity, aluminum nitride, boron nitride (hexagonal, cubical), aluminum, etc. is preferably contained. These heat conductive materials are added and dispersed into silicone resin to form an independent heat conductive layer. Then these layers may be laminated or put on the reflective substrate as a part of the reflective substrate.

For example, 200 parts by mass of rutile-type titanium oxide (produced by Sakai Chemical Industry Co., Ltd., trade name: GTR-100) was added to 100 parts by mass of a silicone base material, obtaining 0.8 mm thick test piece having a size of 70×70 mm. Thermal conductivity and reflectance were measured to be 1.2 w/m·° C. and more than 95% or more over a region of 450-1,000 nm, respectively. On the other hand, to improve the thermal conductivity, 100 parts by mass of rutile-type titanium oxide (produced by Sakai Chemical Industry Co., Ltd., trade name: GTR-100) and 100 parts by mass of alumina (produced by Showa Denko Kabushiki Kaisha, trade name: A-42-6) were added against 100 parts by mass of the silicone base material, obtaining 0.8 mm thick test piece having a size of 70×70 mm. Thermal conductivity and reflectance were measured to be 1.4 w/m·° C. and 85-90% over a region of 450-1,000 nm, respectively. As a comparative experiment, 200 parts by mass of alumina (produced by Showa Denko Kabushiki Kaisha, trade name: A-42-6) were added against 100 parts by mass of the silicone base material, obtaining 0.8 mm thick test piece having a size of 70×70 mm. Thermal conductivity and reflectance were measured to be 1.9 W/m·° C. and 75-80% over a region of 450-1,000 nm, respectively. From the results, thermal conductivity could be improved with maintaining reflectance at a level of 90%. It was found that reflectance and thermal conductivity can be adjusted using lamination and compounding techniques.

To improve reflectance by increase in light scattering on the reflective layer, fluorescence substance, together with white inorganic filler powder, is contained in reflective layer. These particles are exposed to the air so that light is directly reflected at the layer and fluorescence and phosphorescence are produced at the layer during a process starting from a ground state, reaching at an excited state and then coming back to the ground state. As such fluorescent substance, an inorganic or organic fluorescent substance such as halophosphate fluorescent substance, rare earth metal-containing fluorescent substance such as Eu, YAG (Yttrium, Aluminum, Garnet) fluorescent substance can be used.

As reinforcing materials, reinforcing inorganic filler such as silica, kaolin, calciumcarbonate, zinc carbonate, and reinforcing organic filler such as silicone resin powder may be compounded. These reinforcing agent is used in the range of 0-200 parts by mass against 100 parts by mass of total components other than the reinforcing filler.

When titanium oxide, especially anatase-type titanium oxide is used as white inorganic filler 12a•12b in silicone resin reflective substrates 10•20, near-ultraviolet LED and blue LED wavelength are preferably reflected. If the anatase-type titanium oxide is used in less than 3 parts by mass against 100 parts by mass of silicone resin, sufficient reflectivity cannot be achieved. On the other hand, if the amount used exceeds 400 parts by mass, processability and productivity decline, being inconvenient. Anatase-type titanium oxide is preferably contained in the range of 30-300 parts by mass against 100 parts by mass of the silicone resin. Anatase-type titanium oxide having any particle shape can be arbitrarily used. For example flake-like, irregular- and spherical-like shape can be used. The particle size is in the range of 0.05-50 µm, preferably 0.05-30 µm, more preferably 0.1-10 µm. When the surface of titanium oxide is treated with Al, $Al_2O_3$, ZnO, $ZrO_2$, and/or $SiO_2$ etc., oxidative decomposition of organic materials by photocatalytic action caused by titanium oxide can be inhibited, so that long-term usage can be secured.

White titanium oxide powder, especially anatase-type titanium oxide powder in silicone resin reflective substrates 10·20 has far strong decomposing catalytic action when compared with rutile-type titanium oxide. Anatase-type titanium oxide powder has a strong catalytic decomposing activity so that when it is used in housing materials. Dust attached on the surface of the housing material is decomposed. When it added to a polymer compound of the thermoplastic resin such as polycarbonate, polyphthalamid, polyetheretherketone, the polymers are decomposed, yellowed and deteriorated to cause a crack. However, silicone resin, especially silicone resin having a dimethyl siloxy repeating unit as a main component, is chemically stable to anatase-type titanium oxide. Therefore silicone resin reflective substrates 10·20 are stable for a long period of time without yellowing, deformation and degradation. Further, if the surface of the anatase-type titanium oxide is surface-treated with Al, $Al_2O_3$, ZnO, $ZrO_2$, and/or $SiO_2$, the decomposing catalytic action is inhibited, preventing degradation such as yellowing for a long period of time, improving dispersability of the titanium oxide powder in the silicone resin and further improving reflectance of the reflective layer. The surface treatment of the titanium oxide may be carried out by mixing or kneading of titanium oxide together with a bulk powder of the surface treating agent, or immersing titanium oxide into a suspension liquid which contains the bulk powder of the surface treating agent or spraying the suspension liquid on titanium oxide. If titanium oxide is surface-treated, whiteness is improved, and reflectance of the reflective layer is further improved.

The surface of the reflective layer of the silicone resin reflective substrate has a non-specular surface such as a concavo-convex shape, prism-like shape having pyramid or rectangular shape or pearskin-like shape obtained by etching treatment or sandblast treatment. The size of these shapes is from nano meter to micro meter size (100 nm-10 µm). Incoming light is diffused in all direction but is not reflected in a specific direction. Reflectance of the diffused reflection is larger than that of the mirror surface reflection. In the diffused reflection, uniform reflection can be realized, therefore whiteness of the surface is improved. Thereby reflection efficiency is further improved.

Figure 11:
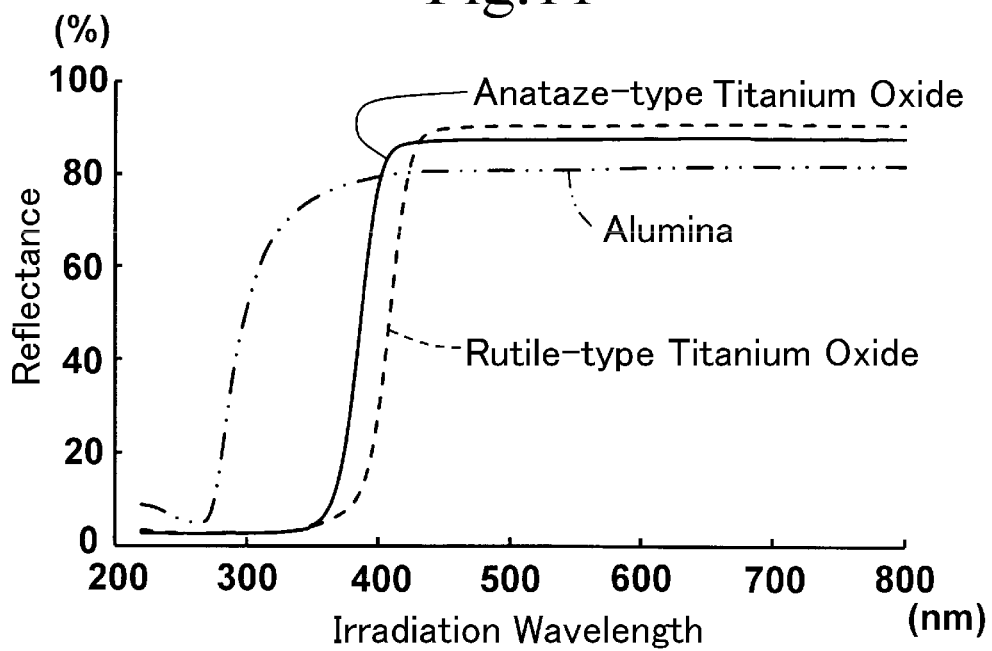
FIG. 11 is a graph showing a correlationship between an irradiation wavelength and a reflectance of a silicone resin reflective substrate, of the present invention.

FIG. 11 is a graph showing a correlationship between an irradiation wavelength and its reflectance. 100 parts by mass of polydimethylsiloxane and 100 parts by mass of polyphenyl siloxane were prepared. 200 parts by mass of anatase-type titanium oxide which is surface-treated with $Al_2O_3$ that is silane-coupling treated, rutile-type titanium oxide which is surface-treated with $Al_2O_3$, and alumina ($Al_2O_3$), are each dispersed and contained in silicone resin reflective substrate respectively.

As clearly shown in FIG. 11, the silicone resin reflective substrate comprising a low reflective index polydimethylsiloxane has a reflectance higher by 3% than that of the polyphenylsiloxane which has a high reflectance, in both cases of the anatase-type titanium oxide and the rutile-type titanate oxide, over a wide wavelength range of 200-1,000 nm, especially over the range of 350-1,000 nm.

At 400 nm the rutile-type titanium oxide-containing silicone resin reflective substrate has a reflectance of only approximately 30% in both cases of polydimethylsiloxane and polyphenylsiloxane, but the anatase-type titanium oxide one has a reflectance that exceeds 80%. Further, the reflectance of anatase-type titanium oxide containing one has higher reflectance than the rutile-type titanium oxide containing one by 40% over the wavelength of 380-420 nm. On the other hand, over the range of 420-1,000 nm, reflectance of the rutile-type titanium oxide containing one is higher than the anatase-type titanium oxide-containing one by 6%.

Anatase-type titanium oxide has a refractive index of 2.45-2.55, but rutile-type titanium oxide has refractive index of 2.61-2.90. On the other hand, refractive index of alumina is about 1.76. Both anatase-type titanium oxide and rutile-type titanium oxide have high refractive index when compared to alumina, therefore, they exhibit a whiter color.

Alumina has a lower refractive index than that of titanium oxide, but it has a high thermal conductivity and high heat radiation performance. As shown in FIG. 11, the silicone resin reflective substrate comprising alumina and polydimethylsiloxane has a higher reflectance than that of the silicone resin reflective substrate comprising alumina and polyphenylsiloxane, over the wavelength of 340-1,000 nm by 6-9%. Conventional silicone resin comprising alumina and polyphenylsiloxane, had a reflectance of approximately 80% over the wavelength of 400 nm or over, being unsuitable for reflective substrate. However, when the base polymer is changed for a silicone resin such as polydimethylsiloxane which has a dimethylsiloxy repeating unit as its main component, reflectance over the wavelength of 400 nm or over becomes 90% or over, even if alumina is used as the white inorganic filler powder. Therefore such composition can be used suitably as a reflective substrate.

Therefore, a combination of a silicone resin having a dimethylsiloxy repeating unit as a main chain and white inorganic filler powder, can be used as a material for the reflective substrate. If a white inorganic filler powder is suitably selected, a reflective substrate having good reflectivity and radiation performance, can be obtained. If titanium is selected as the white inorganic filler powder, reflectivity can be improved. If alumina is selected, radiation performance can be improved. Use of both alumina and titanium together make it possible to adjust the reflectivity and radiation performance, Therefore, the properties of silicone resin reflective substrates 10·20 can be designed depending on an intended use.

Figure 12:
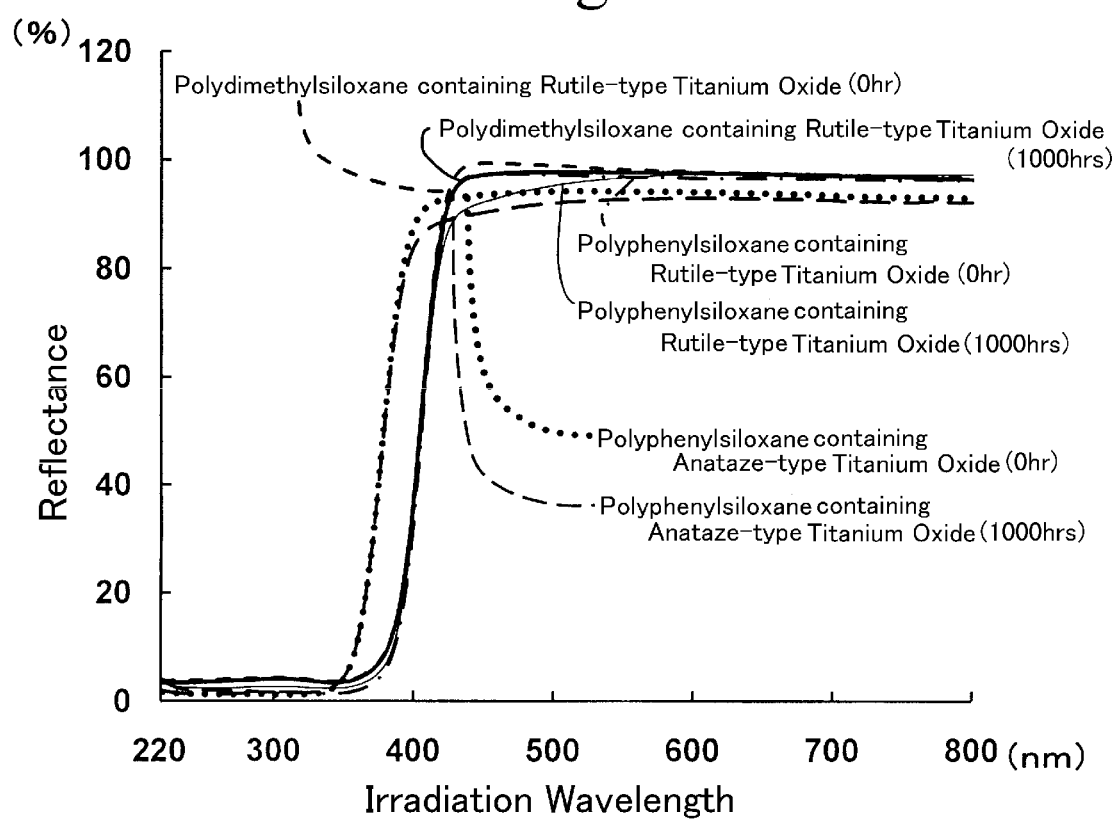
FIG. 12 is a graph showing a correlationship between an irradiation wavelength and reflectance with or without heat on the silicone resin reflective substrate of the present invention, type of the silicone resin being changed.

FIG. 12 is a graph showing a corelationship between irradiation wavelength and its reflectance of silicone resin reflective substrate which comprises 100 parts by mass of polyphenylsiloxane resin and 200 parts by mass of anatase-type titanium oxide or rutile-type titanium oxide, respectively, before and after a 1,000 hours heat aging at 150° C.

As shown in FIG. 12, at a wavelength of 460 nm, a silicone resin comprising a polyphenylsiloxane and rutile-type titanium oxide has reflectance of 97%, and a silicone resin comprising a polydimethylsiloxane and rutile-type titanium oxide has reflectance of 100% or over. The silicone resin which only contains polydimethylsiloxane as the silicone resin has a reflectance higher than the silicone resin which only contains polyphenylsiloxane as the silicone resin over the all wavelength region. On the other hand, a silicone resin comprising a polydimethylsiloxane and rutile-type titanium oxide has reflectance of 100% or over.

Silicone resin reflective substrates 10·20 are formed by heating a liquid-type, grease-type or plastic-type base material composition without solvent through additional reaction. The base material composition comprises a silicone resin base material, white inorganic filler powder 12a·12b and if necessary silane coupling agent. The silicone resin reflective substrate is formed in a molding die using compression molding, injection molding, transfer molding, injection molding (LIMS), extrusion molding, calendar molding, etc. Such liquid-type or grease-type or plastic-type composition may be formed with a thickness of 1-2,000 μm using a coater.

In a case of chip-on-board where an electric circuit is formed by combination of a chip and a device, this base material is coated using a screen-printing technique on a place other than a place on which the chip is mounted.

As a reactive functional group of the silane coupling agent, one that has an alkyloxy group, vinyl group, amino group, epoxy group, etc. is exemplified. In addition to silane coupling agent, titanate-type and aluminate-type coupling agent may be used. When silane coupling agent is contained in this composition, the substrate becomes strong physically because the white inorganic filler powder such as anatase-type titanium oxide is surely incorporated into a 3-dimensional network. In particular, in a case where silane coupling-treated white inorganic filler powder is used in the silicone resin reflective substrate, the white inorganic filler powder is crosslinked to the silicone through the silane coupling agent, the reflective substrate has high bending strength, wettability, dispersibility and quality. Such silane coupling treatment is carried out by adding 1% by mass of silane coupling agent against anatase-type titanium oxide, then stirred using Henschel mixer and then dried at 100-130° C. for 30-90 minutes.

In order to make the white inorganic filler which is exposed to the air, surface polishing is carried out by scrubbing the surface of the silicone resin using an abrasive paper or abrasive cloth having a roughness of #500 to #10,000, a fine particle-containing abrading agent, honing with a grinding stone, buffing with a flexible material such as cloth or leather, and a roller having a file-like concavo-convex surface. Surface roughening can be carried out by sandblast using blowing of metal coarse grains, sand or abrading agents, by wet blast using abrading agents, by abrasion using metal file, by scratching using metal brushes or steal wool, by cleaning using ultraviolet irradiations, by removing of an organic material using corona discharge treatment. These treatments are carried out until the white inorganic filler is exposed to the air. Chemical etching is also carried out using strong acids such as hydrochloric acid, sulfuric acid, nitric acid, hydrofluoric acid, etc. or alkali treatment using caustic soda. Such treatments are carried out until the white inorganic filler is exposed to the air. In a case of surface roughening of the reflective layer, material hardness is preferably 60 or over (JIS A hardness tester) which is governed by JIS K 6253.

Light is reflected on the surface of the white inorganic filler particles which is exposed to the air, reflection efficiency is further improved. Physical polishing is preferably adopted.

Figure 13:
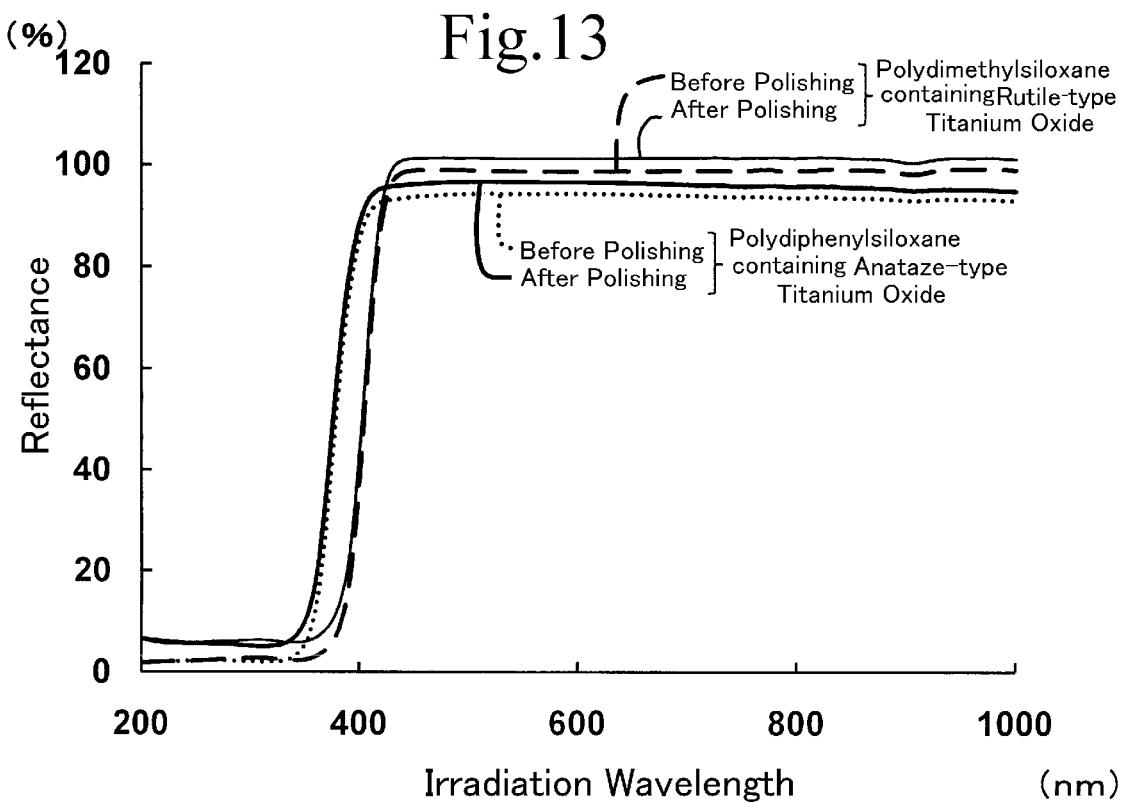
FIG. 13 is a graph showing a correlationship between an irradiation wavelength and reflectance before and after grinding of a silicone resin reflective substrate.

FIG. 13 is a figure showing a correlationship between an irradiation wavelength and its reflectance, before and after polishing of the surface of the silicone resin reflective substrates by scrubbing and sanding with #1,500 sandpaper. 100 parts by mass of anatase-type titanium oxide and rutile-type titanium oxide as the white inorganic filler powder are respectively dispersed and contained in a silicone resin of polydimethylsiloxane to form thus silicone resin reflective substrate.

As shown in FIG. 13, these surface-roughened silicone resin reflective substrates comprising polydimethylsiloxane and polyphenylsiloxane respectively, show higher reflectance, when compared with the original reflective substrates, by about 3% over the broad wavelength range of 200-1,000 nm, irrespective of the kinds of the white inorganic filler powder, i.e., anatase-type titanium oxide or rutile-type titanium oxide. And that, the silicone resin reflective substrate shows the relative reflectance value of approximately 100 when compared to the standard white board (which is identified as 100 and is governed by JIS K 7375). That is to say, the silicone resin reflective substrate has high reflection efficiency.

In particularly, as shown in FIG. 13, the silicone resin reflective substrate, which consists of rutile-type titanium oxide and polydimethylsiloxane, has high reflection efficiency that exceeds 100%, being excellent in reflection efficiency.

These surface-roughened silicone resin reflective substrate tends to adhere to metal. The surface of this silicone resin securely adheres to metal film. In addition, the silicone resin reflective substrate, which comprises coupling-treated white inorganic filler, tends to adhere to metal. The surface of this silicone resin securely adheres to metal film. As the metal film, a plating layer such as copper, silver, gold, nickel, palladium, etc., metal vapor-deposited film, metal foil which is bonded by adhesives or metal spray, etc. can be exemplified.

Generally, silicone resins are usually poor in adhesivenes, so that the resins are hard to be attached to metal foil. However the present silicone resin reflective substrate is excellent in adhesiveness to metal film.

The metal may be directly plated or deposited to provide films on the silicone resin reflective substrate, or metal foil is adhered to the silicone resin reflective substrate through adhesives. The silicone resin reflective substrate may be corona treated, plasma treated, ultraviolet treated, flame treated, itro treated in advance. Or the substrate may be in advance undercoated with a polyparaxylylene using coating treatment, then be coated with a metal film deposited on it.

An example of forming a metal film will be described below. The silicone resin which contains white inorganic filler powder is formed into a platy silicone resin reflective substrate. Then on the substrate, a film or a masking material is applied. Then, in order to provide a coated layer (poly-p-xylylenes —[$(CH_2)$—$C_6H_3Cl$—$(CH_2)$]$_n$— made of, "Palylene C" (Trade name of Nippon Parylene Company)), a powder-like monochloro p-xylylenes dimmer, which is a dimer or a basic ingredient of "Parylene C", is placed in a vaporizing chamber then heated under a reduced pressure, a vaporized dimer is guided into a thermal decomposition chamber and changed into a high reactive p-xylylene monomer radical. Then the radical is deposited on the reflective substrate in a thickness of 0.5-5 μm, preferably 1-2 μm, to produce a poly-p-xylylenes coating-treated layer or an undercoating layer. On the undercoating layer, a silver layer or a metal layer is formed in a thickness of several μm using vacuum vapor deposition. Then a masking material is removed. A silicone resin reflective substrate having low gas permeation coefficient and insulation resistance, on which a metal film is attached, can be obtained.

Instead of metal deposition, metal plating or adhesion of metal foil may be used. Any preparation method can be adopted.

As plating methods, the silicone resin reflective substrate which contains white inorganic filler powder and is formed into plate-like shape, is surface roughened using acid or alkali. Then it is nickel-plated using non-electrolytic nickel plating, and then copper-plating using electrolytic plating is carried out. Gold or silver is plated according to individual needs.

As a method to stick a copper foil, an adhesive layer is at first formed on the rear surface of the copper foil. The adhesive layer side is stuck to the silicone resin reflective substrate that contains the white inorganic filler powder and is formed into a plate-like shape. Heat curing is carried out using hydraulic press to complete a crosslinking adhesion. The copper foil may be a roll-like continuous sheet or an individual sheet cut it. When a rolled copper foil is used, the foil may be drawn out and stuck together with the silicone resin reflective substrate, and then the bonded article may be rolled up.

In a case where a metal layer is provided on the support, a circuit is formed at the metal layer by etching, then a silicone resin base material composition is coated using silk screen printing method on an area other than a connecting and mounting portion of a light emitting diode and thus the silicone resin reflective substrate is formed, a gas barrier layer may be provided between the circuit and the silicone resin reflective substrate.

With the silicone resin reflective substrate being formed from the 3-dimensionally crosslinked silicone resin and the inorganic filler powder, gas permeability of this substrate is higher than that of ordinary resin such as an epoxy resin. Therefore, peeling may occur between the silicone resin reflective substrate and the metal layer due to erosion of metal layer of the circuit and also due to formation of an oxide layer. To prevent such phenomena, a gas impermeable film can be formed between the silicone resin reflective substrate and the metal layer. A flexible or non-flexible film can be used for the gas impermeable film. The thickness of the film is preferably 1-30 μm. Any resin which has gas permeability lower than that of the silicone resin can be arbitrarily used. As such materials, photoresist of epoxy resin, etc., p-xylylene coat, polyimide resin, poly-p-xylylene, urethan resin, acrylresin, polyamide, etc. can be exemplified.

Gas permeability of the silicone resin is so high that corrosive gas is likely to permeate and the metal layer is likely to be eroded. To prevent such phenomena, gas impermeable resin is coated as a gas impermeable layer. And on the layer, the silicone resin reflective substrate should be preferably provided.

On the silicone resin reflective substrate, metal foil or metal plating may be attached. Alternatively, the silicone resin base material composition is coated on the copper foil and stuck to the substrate, and then a pattern may be formed by etching. Or on the substrate, the silicone resin is coated, and then plating may be completed.

The silicone resin reflective substrate is made of silicone resin, so that the reflective layer exhibits non-adherent properties. Therefore when dust and foreign particles such as speck and grit attach to the layer, these dust and foreign particles are easily removed from the layer by tracing the reflective layer with a sticky roller without dust and foreign particles such as speck and grit sticking to the layer. The dust and foreign particles stick to the sticky roller. The silicone resin reflective substrate is non-adherent but has high insulation property, therefore dust and foreign matter tend to attach to the reflective layer due to static electricity. To prevent such phenomena, a silicone hard coat layer is coated on the reflective layer of the silicone resin reflective substrate, and attachment of dust and foreign matter can be prevented. Moreover, dust and foreign matter attached to the layer can be easily removed if they are blown off by sending an air stream. As the silicone hard coating agent which can be used for the silicone resin reflective substrate, the silicone hard agent in which silica or fluoro powder is dispersed, or a silicone coating agent which is used for treating the surface of an air bag, can be used.

Next, with reference to FIG. 1, a lighting fixture or a light emitting apparatus, which has package case 10 which serves as a silicone resin reflective substrate, and silicone resin reflective substrate 20, will be explained. These substrates comprise a silicone resin-containing dimethylsiloxane repeating unit in its main chain and anatase-type titanium oxide particles.

The silicone resin reflective substrate 20, which is a part of the wiring substrate, is made of a silicone resin in which anatase-type titanium oxide particle 12b is contained. From a surface of silicone resin reflective substrate 20, on the surface of which is located on the mounting side of the light emitting diode 13, a portion of titanium oxide particle 12b is exposed to the air. On the surface of the silicone resin reflective substrate 20, conductive metal films or copper films 15a•15b are attached to form a conductive pattern which is connected to an electric current source (not shown). Two leads 14a•14b which extend from light-emitting diode 13 are connected to copper films 15a and 15b, respectively. At a portion other than the conductive pattern portion on the surface of the silicone resin reflective substrate 20, the silicone resin is exposed to the air. At the portion, a portion of anatase-type titanium oxide particle 12b is exposed to the air. Therefore the portion exhibits a white color. Since the portion has an excellent hiding property, the silicone resin reflective substrate 20 can prevent light from leaking. Further, at that portion, reflectance of light becomes extremely high not only over a wavelength of 380-420 nm but also over a longer wavelength of visible light and much longer wavelength of heat ray such as infrared.

The package case 10 is also made of a base material composition having silicone resin and anatase-type titanium oxide particle 12a. The package case 10 surrounds light emitting diode 13, spreads out wide open toward the end in the light outgoing direction along with a sloping inner wall 11 and is adhered in one body through an adhesive layer (not shown) to the surface of the mountain side surface of light emitting diode 13 which is placed on the silicone resin reflective substrate 20 of the wiring substrate. The package case 10 also exhibits white color due to anatase-type titanium oxide particle 12a and the excellent hiding property, so that it can prevents light from leaking, and also exhibits extremely high light reflectance, especially over the wavelength of 380 nm or over, particularly of 400 nm or over.

The silicone resin reflective substrate 20 and package case 10 are formed by a three-dimensionally cross-linked silicone resin having a non-cyclic dimethylsiloxane repeating unit as a main component having chemical stability and resistance to discoloration such as polydimethylsiloxane. Therefore they have high reflectance, maintain white color without yellowing even if they are exposed to high intensity light for a long period of time. And that they have an excellent physical strength, light resistance, heat resistance, anti-weatherability so that they have high durability.

In a lighting apparatus 1, on a surface of the silicone resin reflective substrate 20, the surface of which is located on the non-mounting side of light emitting diode 13, a support body 16 is attached. A plurality pairs of the silicone resin reflective substrate 20 on which light emitting diode 13 is mounted and the package case 10 may be arranged in good order all around to constitute a lighting apparatus. An opening in an outgoing direction side of the package case 10 may be covered by a glass- or resin-made transparent plate or film. The transparent plates or transparent films may contain a colorant, pigment, fluorescence agent, phosphorescence agent which are used to convert the wavelength of transmitted light into an intended wavelength. The opening in the light outgoing direction side of the package case 10 may be covered by a lens such as a convex lens, concave lens, and Fresnel lens, etc. (not shown).

The silicone resin reflective substrate 20 is formed on the support body 16 using coating techniques such as various printing of screen printing, spraying, brushing, and coating, etc.

The support 16 may be any shape such as a non-deformable hard or rigid film-like, plate-like, three-dimensional-like shape such as tubular-like of cylindrical-like, spherical-like, bawl-like shape, etc. It may be a flexible soft sheet like flexible print circuit (FPC), hard but flexible sheet which can be deformed a little to bias, may be a roll which can be roll up, or may be working chips which are provided in various element and require only a small space. The support body may have a conductive property, heat conductivity, heat radiation performance. The support body may have a reflecting layer on the upper surface and may have a sticking or adhesive layer on the back surface.

The material of the support body 16 may be organic materials or inorganic materials. For example, silicone resin, imide resin, bismaleimide•triazine resin, glass fiber-containing epoxy resin (gla-epo), paper phenyl resin, bakelite, polyethylene terephthalate resin, polybuthylene terephthalate resin, polyacrylonitrile resin, plastic film made of resin such as polycarbonate resin, fluororesin, polyimide resin, polyphenylenesulfide resin, aramide resin, polyetherether resin, polyetherimide resin, liquid polymer, polyether sulphonic resin, cycloolefin resin, silicone resin, silicone rubber, aluminum foil, copper foil, nickel foil, etc. are exemplified. These materials are used for producing the support body. But the material is not limited to the above mentioned materials. The silicone resin reflective substrate 20, which constitutes a portion of the wiring substrate, contains an expensive silicone resin comprising a dimethylsiloxy repeating unit as a main component in its main chain. However, in a case where the silicone resin is coated on inexpensive support body 16 in a very small amount, sufficient reflective effect can be achieved, therefore, silicone resins contribute to reduce the production cost.

In such cases, a film-like silicone reflective substrate is preferably formed by coating the base material-containing composition on the support body 16 in a film thickness of 10-200 μm.

The package case 10 and the wiring substrate having the silicone resin reflective substrate 20 are used as follows. When the light emitting diode 13 is energized through negative side copper film 15a and lead 14a and through positive side copper film 15b and lead 14b, the light emitting diode 13 emits light. A portion of the emitted light is directly released to the outside world through an outgoing side opening of the package case 10. Other portion of the emitted light is reflected on the inner wall 11 of the package case 10 and on a portion of the silicone resin reflective substrate 20 which constitutes an area other than the conductive pattern on the surface of the wiring substrate. Then the other portion of the emitted light is released to outside world through the outgoing side opening.

FIG. 2 shows another aspect of the silicone resin reflective substrate that is mounted on another lighting apparatus. A wiring substrate 21 is made of a silicone resin which contains titanium oxide particle 12c which is a white inorganic filler powder having high refractive index. Glass cloth 22 is molded together and laid in the silicone resin. On the surface of the wiring substrate, a conductive metal film or conductive patterns of copper films 15a•15b are formed. Lead wires 14a•14b of a light emitting diode 13 are connected to the copper films 15a and 15b respectively.

FIG. 3 (d) shows another aspect of the silicone resin reflective substrate 1 which is mounted on another lightning apparatus. The conductive metal films 15a•15b, for example copper films, that constitute conductive patterns are attached to the support body 16 made of an appropriate material such as rigid plastics. The package case 10, which is also used as a reflective layer made of silicone resin which contains titanium oxide particle 12 as a white inorganic filler powder having high refractive index, covers support 15 and copper films 15a•15b, as the silicone resin reflective substrate.

The silicone resin reflective substrate 1 in FIG. 3 is produced as follows. At first, as shown in FIG. 3 (a), a glass fiber cloth is immersed into an epoxy resin to form support body 16 made of a glass epoxy substrate. On support body 16, conductive metal films 15a•15b which constitutes a conductive patterns having a desired pattern, is formed using a printing process or chemical etching, etc. Next, a liquid-type or a grease-type or a plastic-type composition comprising a polymerisable silicone resin base material is coated so as to cover the support 16 and the conductive metal film 15a•15b, then pressing and heating is carried out using molding die 31 having many approximate hemisphere shape projections so as to mold it, through three dimensional crosslinking and curing of the polymerizable silicone base material, into the package case 10 which is also used as the reflective layer having a maximum thickness of 100-1,000 μm, and a minimum thickness of 10-100 μm. In the package case 10, the support body 16 and the conductive metal films 15a•15b are closely adhered. When mold 31 is separated from the package case 10, the inner wall 11 which is formed by separation becomes a reflecting surface thereat. Next, as shown in FIG. 3 (c), a hole 32 which reaches to the conductive metal films 15a•15b is formed at the minimum thickness portion of the package case 10. As shown in FIG. 3 (d) in the hole, a light emitting diode is inserted and its negative and positive terminals are connected to the conductive metal films 15a•15b by a connecting material such as solder or the like. If needed, when it is cut to have a predetermined size using a dicing saw 33, a light emitting diode chip for a lighting apparatus can be produced.

As shown in FIG. 4, onto support body 16 on which the conductive metal films (circuit) 15a•15b having a conductive pattern with a desired shape, a liquid composition of a polymerizable silicone resin base material is coated. Then pressing and heating are carried out using a molding die 31 whose surface is treated using sandblast. The polymerizable silicone resin base material is 3-dimensionally crosslinked and cured, then the silicone resin reflective substrate 20 which is also used as a reflective layer is obtained. A barrier layer (not shown) may be formed to prevent peelings using an epoxy resin or polyimide varnish between the conductive metal film and the silicone resin reflective substrate.

Figure 5:
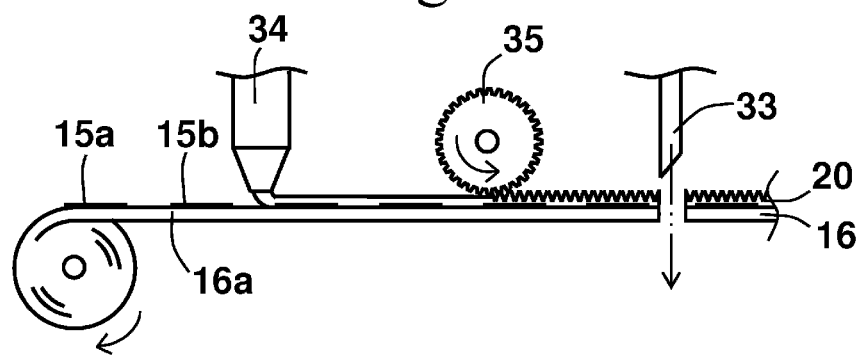
FIG. 5 is a schematic sectional view showing a manufacturing process of another silicone resin reflective substrate 20 using a coating method, of the present invention.

As shown in FIG. 5, at first a support sheet is drawn from a flexible base material roll which is used for support sheet on which the conductive metal films 15a•15b having a desired conductive pattern is attached. A polymerizable silicone resin base material which flows out from a coating nozzle 34 is coated on the surface of the conductive metal films 15a•15b side. And then it is pressed and heated using a sandblast-treated roller 35, the polymerizable silicone resin base material is 3-dimensionally crosslinked and cured. Thereby, the silicone resin reflective substrate 20 which is also used as the reflective layer, is formed. If necessary, it may be cut into a desired shape using a dicing saw 33.

As shown in FIGS. 4 and 5, the silicone resin reflective substrate 20 is subjected to be machine cut in a thickness direction until the conductive metal films 15a•15b are exposed to the air so as to form a dent in the package case while rotating a taper-shaped grinder 36 as shown in FIG. 6 (a) or approximate hemisphere-like grinder 36 as shown in FIG. 6 (b). Then if needed, a light emitting diode is mounted to produce a lighting apparatus (not shown). As shown in FIG. 6 (c), the reflective substrate 20 may be groove-likely machine cut until the conductive metal films 15a•15b are exposed to the air while rotating a disk-like grinder 36 thereat.

On the other hand, the silicone resin reflective substrate 20, as shown in FIG. 7, is machine cut and ground until a grinder reaches to the conductive metal films 15a•15b while rotating a roller-shaped grinder 36 at a high rotating speed. On the support body 16, the conductive metal films 15a•15b and the silicone resin reflective substrate 20 which serves as a reflective layer may be separated off and arranged tightly and exposed to the air.

Figure 8:
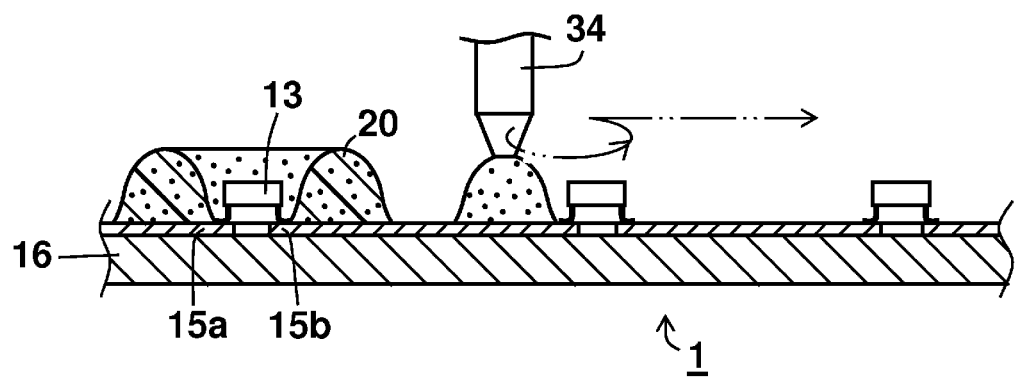
FIG. 8 is a schematic sectional view showing a manufacturing process of another silicone resin reflective substrate using a piling up method, of the present invention.

As shown in FIG. 8, the silicone resin reflective substrate 1 has a conductive pattern which has a desired shape and is attached to the support body 16. The conductive metal films 15a•15b are connected to light emitting diode 13 of a light emitting device. A polymerizable silicone resin base material which flows out from a nozzle 34 is dropped so as to make a bank to surround the light emitting diode 13.

Figure 9:
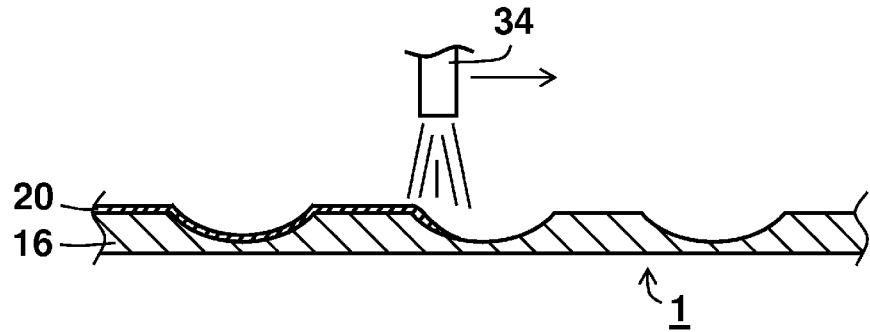
FIG. 9 is a schematic sectional view showing a manufacturing process of another silicone resin reflective substrate using a spray coating method, of the present invention.

The silicone resin reflective substrate 1 has, as shown in FIG. 9, the support body 16 which is used as a package case having dents. On the surface of the support body 16, a polymerizable silicone resin base material may be spray-coated and heated so as to form the silicone resin reflective substrate 20 which serves as a reflective layer.

At the time of molding of the silicone resin reflective substrate 1, a releasing agent such as Diefree (trade name; produced by Daikin Industries, Ltd.) may be coated on a molding die every time the die is released or every several or every dozen releasing times, to further improve releasability.

Figure 10:
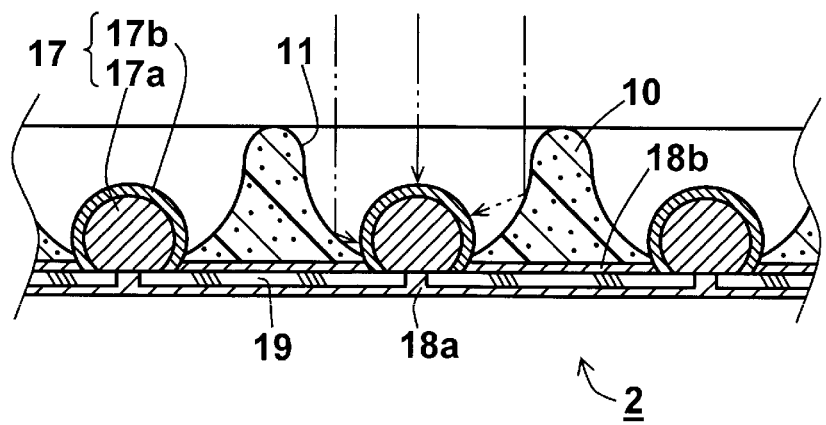
FIG. 10 is a schematic sectional view showing a solar cell with another silicone resin reflective substrate 10, of the present invention.

Another aspect of the silicone resin reflective substrate, as shown in FIG. 10, is used as an assembly of a solar cell 2. The reflective substrate is used as the package case 10 on which a solar cell element 17 as a photoelectric conversion element, are mounted. The package case 10 comprises anatase-type titanium oxide particle 12a and silicone resin, and has a plurality of bowl-like lines are arranged side by side. Solar cell element 17 comprises approximate spherical p-type silicone resin to form the semi conductor 17a which is located in an inner portion and n-type silicone semiconductor 17b which cover the outer surface of the semiconductor 17a and constitutes a PN junction. A lower edge of the n-type silicone semiconductor 17b is a missing part by polishing. From this missing part, p-type silicone semiconductor is exposed. The n-type silicone semiconductor 17b is connected only to copper film 18b which is an electrode element layer or a negative electrode. On the other hand, the p-type silicone semiconductor 17a is connected only to the copper film 18a which is an electrode element layer or a positive electrode. Both electrodes, copper films 18a•18b, are separated and insulated by an insulating body layer 19 which is laminated between the copper films 18a, 18b. The package case 10 surrounds solar cell element 17 and has an opening which is formed by inner wall 11 which has a bowl like shape and which gradually spreads out in the outgoing direction. Package case 10 is adhered to copper film 18b through an adhesive layer (not shown) in one body.

The package case 10 or the silicone resin reflective substrate is used as follows. As shown in FIG. 10, light, for example sunlight, falls toward the solar cell element 17 of the solar cell assembly 2. The sunlight which falls straightly and becomes just from directly above hits the top portion of the solar cell element 17. An incoming sunlight which falls on an area somewhat different from the solar cell element 17 reflects at the inner wall 11 of the package case 10 and then falls on a side surface of the solar cell element 17 somewhat perpendicularly to the element 17. Thus the light which incomes into the solar cell assembly 2 reaches efficiently to the PN junction interface of n-type silicone semiconductor 17b and the p-type silicone semiconductor 17a. A photo voltaic power is generated and photo current can flow through a circuit.

As shown in FIGS. 1 to 10, the surface of the silicone resin of the silicone reflective substrate 20 or the surface of the mounting surface side of the light emitting diode 13 of the wiring substrate or the surface of the inner wall 11 of package case 10 may be surface treated using polishing, roughening and/or chemical etching techniques. A part of a white inorganic filler particle may be exposed to the air from the surface of the silicone resin.

The package case 10 and the surface of the silicone resin reflective substrate 20 (or the wiring substrate), the surface of which is located on the mounting side of the light emitting diode 13, is bonded in one body through an adhesive layer. As silicone resin adhesives, for example, low molecular weight siloxane-cut grade SE-9186L (trade name, produced by Dow Corning Toray Co., Ltd.) can be exemplified.

The silicone resin reflective substrate is used for light emitting devices such as a lighting apparatus illustrated by a desk lamp using a filament lamp, a halogen lamp, LED, etc. The reflective substrate can be used for reflecting light like solar cell, etc. It also can be used for reflecting infrared ray to improve heating efficiency by patching the reflective substrate on walls near to heat sources of electric heaters, burning stoves, etc. It can be used as protective layers to protect walls of furniture and fixtures from being damaged, as well as the heat sources.

WORKING EXAMPLES

Examples of experimentally manufactured silicone resin reflective substrates and devices of the present invention will be described hereinafter.

Example 1

Comparison of Initial Reflectance
(Comparison Between Polyphenylsiloxane Resin and Polydimethylsiloxane Resin)
To polyphenylsiloxane resin (Trade name: XE 14-C2508: Momentive Performance Materials Inc.) and polydimethylsiloxane resin (Trade name: IVSM 4500, Momentive Performance Materials Inc.), 200 parts by mass of anatase-type titanium oxide (Trade name: A-950, Sakai Chemical Industry Co., Ltd.), rutile-type titanium oxide (Trade name: GTR-100, Sakai Chemical Industry Co., Ltd.) and alumina (Trade name: AES12, Sumitomo Chemical Co., Ltd.) are added respectively. 25 μm thick polyimide was used as a support body and a 70 mm long, 70 mm wide and 0.3 mm thick silicone resin reflective substrate which is a silicone white reflective plate was obtained under curing condition of 150° C.×10 min. using heat press. Each reflectance was measured using spectral photometer UV-3150 (Shimadzu Corporation). The results are shown in FIG. 11. In a case where polydimethyl siloxane was used as a base polymer, reflectances were improved by 3-5%.

Example 2

Reflectance After Heat Aging at High Temperature

To polyphenylsiloxane resin (Trade name XE 14-C2508: Momentive Performance Materials Inc.) and polydimethylsiloxane resin (Trade name IVSM 4500: Momentive Performance Materials Inc.), 200 part by mass of anatase-type titanium oxide (Trade name A-950: Sakai Chemical Industry Co., Ltd.) and rutile-type titanium oxide (Trade name GTR-100: Sakai Chemical Industry Co., Ltd.) were added respectively and then cured at 150° C. for 10 min. on a 25 μm thick polyimide support body using a heat press to form a reflective layer. The silicone white reflective plates or the silicone resin reflective substrates (70 mm long 70 mm wide and 0.3 mm thick) were obtained respectively. Then they were heat-aged at 150° C. for 1,000 hours. Reflectance was measured using spectral photometer UV-3150 (Shimadze Corporation). The results are shown in FIG. 12. In the silicone white reflective plate comprising polyphenylsiloxane resin, there was a deterioration in reflectance at short wavelength, but in the silicone white reflective plate comprising polydimethylsiloxane, no deterioration in reflectance was observed.

Example 3

To polymethylsiloxane resin (Trade name IVSM 4500: Momentive Reflectance Materials Inc.), 100 parts by mass of anatase-type titanium oxide (Trade name A-950: Sakai Chemical Industry Co., Ltd.) and rutile-type titanium oxide (Trade name GTR-100: Sakai Chemical Industry Co., Ltd.) were added respectively, and then cured at 150° C. for 10 min. to form a reflecting layer using a heat press. Silicone white reflective plates or silicone resin reflective substrates measuring 70 mm long, 70 mm wide and 0.3 mm thick were obtained respectively. The initial reflectance was measured using spectral photometer UV-3150 (Shimadzu Corporation). And then the surface of the silicone white reflective plates was ground using #1500 sand paper. Reflectance of them was measured again. The results are shown in FIG. 13. Reflectance was improved by 2-3% after surface treatment using such as grinding processing.

As clearly seen above, the reflective plate made of polyphenylsiloxane resin had a sufficient reflectance. And the polydimethylsiloxane base reflective plate had higher reflectance than that of polyphenylsiloxane base one. Further, a decrease in reflectance was not observed even after 1,000 hours. Yellowing and deterioration was not observed. It was found that they were excellent in light resistance, heat resistance and exhibited good antiweatherability, and were useful as a reflective material. Further it was found that reflectance can be improved by a surface treatment.

Example 4

To polydimethylsiloxane resin (Trade name IVSM 4500: Momentive Performance Materials Inc.), 100 parts by mass of rutile-type titanium oxide (Trade name GTR-100: Sakai Chemical Industry Co., Ltd.) was added, then cured at 150° C. for 10 min. on a polyimide support having a thickness of 25 μm using heat pressing to form a reflective layer. A white silicone resin reflective substrate measuring 70 mm long, 70 mm wide and 50 μm thick was obtained.

Comparative Example 1

The same procedure was carried out as described in Example 4 except that 100 parts by mass of rutile-type titanium oxide (Trade name GTR-100: Sakai Chemical Industry Co., Ltd.) was added against 100 parts by mass of epoxy resin to obtain an epoxy resin white reflective sheet.

Figure 14:
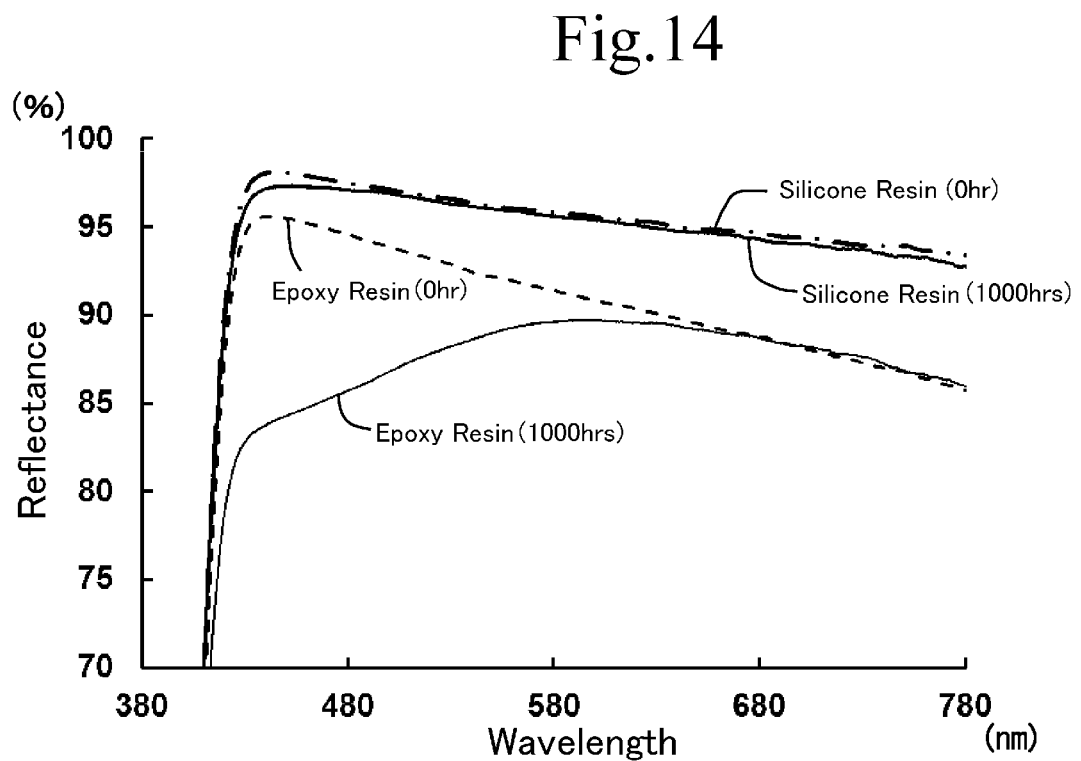
FIG. 14 is a graph showing a correlationship between an irradiation wavelength and reflectance in comparison between an epoxy resin reflective substrate which is inapplicable to the present invention and silicone resin reflective substrate of the present invention.

A heat resistance test of the silicone resin reflective substrate in Example 4 and the reflecting sheet in Comparative Example 1 was carried out using the same procedure as described in Example 2. Reflectance was measured before and after the heating processing at 150° C. for 1,000 hours, using spectral photometer UV-3150 (Shimadzu Corporation). The results are shown in FIG. 14. As clearly seen from FIG. 14, reflectance of the epoxy resin white reflective sheet was lower than that of polydimethylsiloxane over the all wavelength region. Further in the heat-aged epoxy resin white reflective sheet, a significant decrease in reflectance was observed over the short wavelength region. On the other hand, a decrease in reflectance was not observed for the polydimethylsiloxane reflective substrate.

Example 5

A film comprising a 25 μm polyimide film and 15 μm thick copper plating on the polyimide film was used as a support body. A circuit was formed to the copper plaiting using photoresist and etching treatment. Next, 150-200 parts by mass of anatase-type titanium oxide and if needed an adequate amount of silicone rubber powder was added against 100 parts by mass of silicone resin to prepare a base material composition which was used for an anataze-type titanium oxide-containing white reflective material. Then, on the surface of the circuit other than a portion which was used for LED chips and its wiring, the base material composition was coated in a thickness of 30 μm using screen printing method, and then heated at 150° C. for one hour to form a reflective layer. Thus silicone resin reflective substrates were obtained. At that time, the hardness of the reflective layer of the silicone resin reflective substrate was 80 when measured by JIS A type hardness tester and also was 70 when measured by JIS D type hardness tester.

Example 6

A film comprising a 25 μm polyimide film and 15 μm thick copper plating on the polyimide film was used as a support body. A circuit was formed to the copper plaiting using photoresist and etching treatment. Next, 150-200 parts by mass of anatase-type titanium oxide and if needed an adequate amount of silicone rubber powder was added against 100 parts by mass of silicone resin to prepare a base material composition which was used for an anataze-type titanium oxide-containing white reflective material. Then, on the all surface of the circuit including a portion which is used for LED chips and its wiring, the base material composition was coated in a thickness of 30 μm using screen printing method, and then heated at 150° C. for one hour to form a reflective layer. At that time, the hardness of the reflecting layer was 70 when measured by JIS D type hardness tester. And then, as shown in FIG. 7, the reflective layer was ground until the copper plating was exposed to the air. In the thus obtained silicone resin white reflective substrate, the copper plating portion and the silicone resin portion were separated off. Thus silicone resin reflective substrates were obtained.

Example 7

A film comprising a 25 μm polyimide film and 15 μm thick copper plating on the polyimide film was used as a support body. A circuit was formed to the copper plating using photoresist and etching treatment. On the surface of the circuit other than the portion used for LED chips and its wiring, polyimide varnish (Trade name: FC-114 Fine Polyimide Varnish: Fine Chemical Japan Co., Ltd.) was coated two times and then heat cured to provide a 4 μm thick gas barrier layer. Then a silicone resin white reflective substrate (the hardness of the reflective layer was the same value) was obtained according to the same procedure as described in Example 5.

Example 8

To a silicone adhesive (Trade name X-32-1964: Shin-Etsu Chemical Co., ltd.), 100 parts by mass of rutile-type titanium oxide (Trade name GTR-100: Sakai Chemical Industry Co., Ltd.) was added. Further, 0.01 parts by mass of acetylene alcohol or a reaction inhibitor was added to obtain a liquid-type base material composition (viscosity: 600 Pa·s) which is used for a silicone resin reflective substrate. A storage container in which the base material composition had been stored was opened and kept still as it was for 7 days and then viscosity was measured but no change in viscosity was observed. Sedimentation of titanium oxide could not be observed. When heat-cured at 150° C. for one hour, both reflectance and hardness showed the same properties as originally had, showing excellent long term storage stability. As shown in FIG. 1, it was found that LED was able to be mounted and a good production rate was observed.

Comparative Example 2

In a case of one-component type epoxy resin resist ink, when a storage container was opened and kept still as it was at room temperature for 24 hours. The epoxy resin resist ink became cured at its outer periphery and gelation was observed inside of the container. Therefore the ink could not be used any more.

Example 9

As a chip-on-film (hereinafter abbreviated to COF), a circuit was formed to 8 μm thick conductor (copper foil) on 38 μm thick polyimide film. A polyimide varnish (trade name: FC-114 Fine Polyimide Varnish: Fine Chemical Japan Co., Ltd.) was coated two times as a gas barrier layer on a portion other than a land pattern, then heat cured to form 4 μm thick gas barrier. Then a white inorganic filler-containing base material composition was coated on a portion other than the land pattern portion in a thickness of 30 μm using screen printing method. Then it was cured at 150° C. for one hour to form a reflective layer. Thus COF silicone resin reflective substrate was obtained. A white inorganic filler-containing base material composition was prepared by adding 80 parts by mass of anatase-type titanium oxide (Trade name A-950: Sakai Chemical Industry Co., Ltd.) and rutile-type titanium oxide (Trade name GTR-100: Sakai Chemical Industry Co., Ltd.) to 100 parts by mass of polydimethyl-siloxane resin (Trade name IVSM 4500: Momentive Performance Materials Inc.). Onto the land portion of this silicone resin reflective substrate, a white LED package NSSW 064 (Trade name: Nichia Corporation) was directly mounted, and it was led to pass through lead-free reflow soldering. Thus a flexible LED lighting substrate of a high reflective COF substrate was obtained. This substrate is thin in thickness so that it can be inserted into small spaces. Yellowing is not observed and the COF has a high reflectance of 98%. Also no peeling between the metal and the reflecting layer was observed.

Example 10

A silicone resin reflective substrate was prepared by the same procedure as described in Examples 1 to 10 except that after the silicone resin base material composition was prepared, the composition was kept under a reduced pressure and/or at 200° C. until the amount of a low molecular weight polysiloxane having 4-10 silicone repeating units became less than 300 ppm in the silicone resin and then the pressure was returned to the atmospheric pressure. A silicone resin reflective substrates were made from the compositions. The LED lighting substrate was produced by mounting the LED. No trouble in electric contact, no undesired phenomena such as illumination reduction caused from generation of tarnish or cloud were observed.

Example 11

A silicone resin reflective substrate was prepared by the same procedure as described in Example 1 except that titanium oxide was immersed into the reactive group-containing polysiloxane represented by the chemical formula (1) as a silane coupling agent for a surface treatment. Bending strength and hardness of the resin reflective substrate were improved like the case shown in Table 1 when compared to the case in which titanium oxide was not surface treated.

Example 12

After a circuit was formed by the same procedure as described in Example 9, the titanium oxide-containing dimethyl silicone resin base material composition was coated, using screen printing method, on a portion other than a land pattern portion with the size of which fits into ϕ 1 mm. Then heat curing was carried out at 150° C. for one hour. A reflective layer was formed without flowing down of the composition onto the small land pattern having the size fitting into ϕ 1 mm.

Example 13

After a circuit was formed by the same procedure as described in Example 9, the titanium oxide-containing dimethyl silicone resin base material composition was coated, using screen printing method, on a portion other than a land pattern portion with the size of which fits into ϕ 1 mm. Then heat curing was carried out at 150° C. for one hour. A reflecting layer was formed without flowing down of the composition onto the small land pattern having a size smaller than ϕ 1 mm. Further, the surface was ground using #1000 sandpaper to make titanium oxide powder be exposed to the air. The reflectance of the substrate was measured. It was found that the reflectance was improved by 3%.

Example 14

After a circuit was formed according to the same procedure as described in Example 9, a dimethylsilicone resin base material composition comprising 100 parts by mass of anatase-type titanium oxide as the inorganic white filler powder and 3 parts by mass of YAG fluorescence substance was coated, using screen printing method, on a portion other than a land pattern portion with the size of which fits into ϕ 1 mm. Then heat curing was carried out at 150° C. for one hour. A reflective layer was formed without flowing down of the composition onto the small land pattern the size of which fits into ϕ 1 mm. The surface was ground using #1000 sandpaper to make the titanium oxide powder be exposed to the air. The reflectance of the substrate was measured. The reflectance showed 90%. Absorption over the range of 400-500 nm was observed and the reflectance was slightly come down thereby. However, sufficient reflectance was maintained. Exciting light at 550 nm was observed.

Example 15

A 25 μm polyimide film was used as a support body. The film is subjected to a plasma treatment and then primer treatment. As a reflective layer, 200 parts by mass of anatase-type titanium oxide of which the surface was surface treated with alumina was dispersed in 100 parts by mass of a silicone resin. And then the reflective layer was coated thereby on the film in a thickness of 30 μm. On the rear surface of the support, a silicone adhesive was coated with the thickness of 30 μm, then a release sheet was laid and then was heated at 150° C. for one hour. Thus a coverlay film having the reflective layer and the adherent layer was obtained. A hole was made to the coverlay film so as not to cover the land pattern. The coverlay film was aligned to FR-4-substrate having the circuit and then pasted together.

Example 16

A silicone resin reflective substrate was prepared by the same procedure as described in Examples 1-15 except that after a silicone resin base material composition was prepared, the composition was kept under a reduced pressure and/or at 200° C. until the content of a low molecular weight polysiloxane having 4-10 siloxane repeating units becomes less than 300 ppm, and then the pressure was returned the atmospheric pressure. The silicone resin reflective substrates were made of the compositions. Then LED lighting substrate was produced by mounting the LED. No trouble in electric contact, no undesirable phenomena such as illumination decrease caused from generation of tarnish or cloud were observed.

Example 17

A silicone resin reflective substrate was prepared according to the same procedure as described in Example 1 except that titanium oxide was immersed into the reactive group-containing polysiloxane represented by the chemical formula (1) as a silane coupling agent. Bending strength and hardness of the resin reflective substrate were improved like the case shown in Table 1 when compared to the case in which titanium oxide was not surface treated.

Example of Trial Manufacturing 1

As a chip on board (hereinafter abbreviated to COB), a circuit was formed to an 8 μm thick copper foil conductor on a glass-epoxy substrate (FR-4 substrate). An epoxy resin was coated on a portion other than a land pattern portion for forming a gas barrier layer and then cured at 150° C. for 4 hours. A titanium oxide-containing silicone resin base material composition (the base material composition comprises 100 parts by mass of polydimethylsiloxane resin (Trade name IVSM 4500: Momentive Performance Materials Inc.) and 80 parts by mass of anatase-type titanium oxide (Trade name A-950: Sakai Chemical Industry Co., Ltd.) and rutile-type titanium oxide (Trade name GTR-100: Sakai Chemical Industry Co., Ltd.)) was coated using screen printing. Then curing was carried out at 150° C. for one hour to obtain a reflective substrate having a silicone resin reflective layer of COF. A white LED package NSSW064 (Nichia Corporation) was directly mounted on the film. Then it was led to pass through a lead-free reflow furnace to perform soldering. Thus a high reflective COB substrate was obtained.

Example of Trial Manufacturing 2

According to the same procedure as described in Example of Trial Manufacturing 1, a substrate having COB silicone resin reflective layer was obtained. A bare chip (LED element itself) was directly mounted to a land pattern on the substrate and then wire bonded (gold wire) and sealing was carried out using a silicone transparent resin. Thus a glass-epoxy LED lighting substrate was obtained. Yellowing caused from heat was not observed in the substrate, and COB had reflectance of as high as 98%.

Example of Trial Manufacturing 3

As COB, an 8 μm conductor (copper foil) was formed on a BT resin substrate (Mitsubishi Gas Chemical Company, Inc.), an epoxy resin was coated on a portion other than a land pattern portion in 20 μm thick as a gas barrier, then cured at 150° C. for 4 hours, a reflective layer was coated using screen printing and then cured at 150° C. for one hour. Thus a substrate having a COB silicone resin reflective layer was prepared. A bare chip (LED element itself) was directly mounted on the substrate and wire-bonded (gold wire). Then sealing was carried out using a silicone transparent resin. Further, a titanium oxide-containing silicone resin base material composition was discharged as a reflective frame in a height of 0.5 mm using a dispenser to surround a periphery of the resin-sealed bare chip. Thick material molding was carried out using a heat curing method at 150° C. for one hour, to prepare a high reflective COB with a silicone resin reflective frame.

Example of Trial Manufacturing 4

After a circuit was formed according to the same procedure as described in Example of Trial Manufacturing 1, Example of Trial Manufacturing 5

After a circuit was formed according to the same procedure as described in Example of Trial Manufacturing 1, a titanate oxide-containing dimethyl silicone resin base material composition was coated on a portion other than a land pattern portion with the size of which fits to φ 1 mm, then heat curing was carried out at 150° C. for one hour. A reflective layer was formed without flowing down of the composition onto the small land pattern the size of which fits into φ 1 mm. Further, the surface was ground using #1000 sandpaper to make the titanium oxide powder be exposed to the air. The reflectance of the substrate was measured. It was found that the reflectance was improved by 3%.

Example of Trial Manufacturing 6

After a circuit was formed according to the same procedure as described in Example of Trial Manufacturing 1, a dimethyl silicone resin base material composition containing 100 parts by mass of anatase-type titanium oxide as the inorganic white filler powder and 3 parts by mass of YAG fluorescent substance was coated, using screen printing method, on a portion other than a land pattern portion with the size of which fits to φ 1 mm. Then heat curing was carried out at 150° C. for one hour. A reflective layer was formed without flowing down of the composition onto the small land pattern with the size of which fits to φ 1 mm. The surface of the reflective layer was ground using #1000 sandpaper to make the inorganic white filler powder be exposed to the air. The reflectance of the substrate was measured. The reflectance showed 90%. Absorption over the range of 400-500 nm was observed. Accordingly, the reflectance was slightly come down thereby. However, sufficient reflectance was maintained. Exciting light at 550 nm was observed.

Example of Trial Manufacturing 7

A 25 μm polyimide film was used as a support. The film is subjected to a plasma treatment and then primer treatment. As a reflective layer, 200 parts by mass of anatase-type titanium oxide, of which the surface was surface treated with alumina, was dispersed in 100 parts by mass of a silicone resin and then it was coated on the film in the thickness of 30 μm. On the rear surface of the support, a silicone adhesive was coated with the thickness of 10 μm, then a 50 μm thick aluminum foil was laid as a thermal conductive layer. Further the adhesive was coated in a thickness of 10 μm then a release sheet was laid, and then was heated at 150° C. for one hour. Thus a coverlay film having a reflective layer and an adherent layer was obtained. A hole was made to the coverlay film so as not to cover the land pattern. The coverlay film was aligned to FR-4 substrate having the circuit and then they were pasted together.

Example of Trial Manufacturing 8

A silicone resin base material compound was prepared according to the same procedure as described in Example 7. 1 mm height doughnut-shape potting which serves as a high reflective frame and also serves as a casing whose maximum outer diameter was 3 mm was formed around a bare chip which was soldered to a conductive circuit on a support body made of a 25 μm thick polyimide film. Chip relevant places were sealed by a transparent silicone resin. Thus a reflective substrate was formed. This reflective substrate was bent to a 20 mm radius of curvature, but reflection anomaly was not observed. The hardness of the potting portion was a Shore D hardness of 70 when measured using a JIS D hardness tester.

As is shown in Examples of Trial Manufacturing 1-7, a liquid-type or a plastic-type base material composition comprising a silicone resin and a white inorganic filler powder having refractive index higher than that of the silicone resin, can be used in combination with a plate-like support body as well as a support body.

As is shown in Example of Trial Manufacturing 8, a liquid-type or a plastic-type base material composition containing a silicone resin and a white inorganic filler having a refractive index higher than that of the silicone resin, can be used as a casing for a bare chip if a curvature radius of bending of the support body is more than 20 mm at the time the support is bent, even though potting is formed in such a space-saving manner in which the potting diameter is 4 mm or less.

INDUSTRIAL APPLICABILITY

The silicone resin reflective substrate of the present invention is mounted on a light emitting apparatus such as a light emitting element such as a light emitting diode, filament lamp, halogen lamp, mercury lamp, fluorescent lamp, etc. and is used for a wiring substrate, or package case, etc. which are mounted to the light-emitting light sources of the light emitting apparatuses, in order to reflect an emitted light or to make light outgo toward a desired direction. Also this silicone resin reflective substrate is mounted on a photoelectric conversion element such as a solar cell element, etc. The reflective substrate reflects an incoming light so as to collect light to the photoelectric conversion element, and is used for a wiring substrate, package case, etc. which are mounted on the photoelectric conversion element.

The method for manufacturing a silicone resin reflective substrate of the present invention is useful for manufacturing these luminescent devices.

The base material composition of the present invention is useful for easily forming a silicone resin reflective substrate using coating, spraying, immersing, molding method.

The base material composition of the present invention can be stored stably at a room temperature, so that the composition can be stored in cans and can be sold as resist inks for a product. It can be used for forming reflecting layers by arbitrarily adjusting its viscosity.

The invention claimed is:

1. A silicone resin reflective substrate made from a base material composition, which has a plasticity to be cured for the reflective substrate so that a white inorganic filler powder is incorporated into a 3-dimensionally cross-linked silicone resin,
the base material composition containing:
base materials including a polymerisable silicone resin, and
the white inorganic filler powder including titanium oxide surface-treated with Al, $Al_2O_3$, ZnO, $ZrO_2$, $SiO_2$ and/or a silane coupling agent, which has a higher refractive index than that of the 3-dimensionally cross-linked silicone resin; wherein
the base material composition is a liquid-like base material, and the base material composition of the liquid-like base material has a viscosity of 0.5-500 Pa·s, or
the base material composition is a grease-like, a plastic-like or a millable-type base material composition, and the base material composition of the grease-like, the plastic-like or the millable-type base material composition has a plasticity number of 100-500 mm/100, a surface of the silicone resin reflective substrate is made into a continuous non-specular surface having a nanometer-micrometer size of 100 nm-10 μm of a concavo-convex shape, prism shape and/or pearskin shape, at least a part of the white inorganic filler powder is exposed to the air on a surface of the silicone resin reflective substrate, and a particle size of the white inorganic filler powder is in the range of 0.05-50 μm.

2. The silicone resin reflective substrate according to claim 1, wherein the base material composition contains a reaction inhibitor which is deactivated or vaporized when heated.

3. The silicone resin reflective substrate according to claim 1, wherein the base material composition contains an organic solvent and/or a reactive diluent for adjusting viscosity.

4. The silicone resin reflective substrate according to claim 1, wherein the base material composition contains an adhesive component of a silane compound or siloxane compound having a reactive functional group.

5. The silicone resin reflective substrate according to claim 4, wherein the reactive functional group is selected from the group consisting of a vinyl group, a phenyl group, an alkoxy group, an epoxy ring-containing group, and a methacryloyl group.

6. The silicone resin reflective substrate according to claim 4, wherein the adhesive component is selected from the group consisting of $CH_2$=$CHSi(OCH_3)_3$, $C_6H_5Si(OCH_3)_3$, $CH_2$=$CHSi(OCH_2H_4OCH_3)_3$, $C_2H_3O$—$CH_2O(CH_2)_3Si(OCH_3)_3$, $C_2H_3O$—$CH_2O(CH_2)_3SiCH_3(OCH_3)_2$, $CH_2$=$CH$—$CO$—$O(CH_2)_3SiCH_3(OCH_3)_2$, $CH_2$=$CCH_3$—$CO$—$O(CH_2)_3SiCH_3(OCH_3)_2$, 2-(2, 3-epoxypropyloxy propyl)-2, 4, 6, 8-tetramethyl-cyclotetrasiloxane, and 2-(2, 3-epoxypropyloxypropyl)-2, 4, 6, 8-tetramethyl-6-(trimethoxysilylethyl) cyclotetrasiloxane.

7. The silicone resin reflective substrate according to claim 1, the base material composition being cured, wherein the cured base material composition is bonded to a support body as a film-like shape, 3-dimensional-like shape or plate-like shape of the silicone resin reflective substrate.

8. The silicone resin reflective substrate according to claim 1, wherein the silicone resin reflective substrate is a package case and/or a wiring face plate.

9. The silicone resin reflective substrate according to claim 1, the base material composition being cured, wherein the cured base material composition is comprised in the silicone resin reflective substrate, and maintaining reflectance level of 85% or higher at all wavelength in the range of 450 to 1,000 nm and a reflectance level of 90% or higher at a region of 450 nm.

10. The silicone resin reflective substrate according to claim 9, wherein both of light reflectance before/after heat aging at 150° C. for 1,000 hours of the silicone resin reflective substrate are at least 85% at any one of the wavelength in the range of 460-800 nm.

11. The silicone resin reflective substrate according to claim 1, wherein the polymerisable silicone resin contains a non-cyclic dimethylsiloxy repeating unit as a main component.

12. The silicone resin reflective substrate according to claim 1, wherein an amount of a polysiloxane having 4-10 siloxy group repeating units in the base materials is 300 ppm at a maximum.

13. The silicone resin reflective substrate according to claim 1, wherein the reflective substrate that is formed has a thickness of 1-2,000 μm.

14. The silicone resin reflective substrate according to claim 1, wherein a reflective index of the silicone resin is not less than 1.35 and less than 1.65.

15. The silicone resin reflective substrate according to claim 1, wherein the white inorganic filler powder further includes at least one of a light reflective agent selected from the group consisting of alumina, barium sulfate, magnesia, aluminum nitride, boron nitride, barium titanate, kaolin, talc, calcium carbonate, zinc oxide, silica, mica powder, glass powder, nickel powder, and aluminum powder.

16. The silicone resin reflective substrate according to claim 15, wherein the white inorganic filler powder is subjected to a silane-coupling treatment and dispersed in the base materials.

17. The silicone resin reflective substrate according to claim 1, wherein the white inorganic filler powder is an anatase-type titanium oxide or rutile-type titanium oxide.

18. The silicone resin reflective substrate according to claim 17, wherein said titanium oxide is surface-treated and covered with Al, $Al_2O_3$, ZnO, $ZrO_2$, $SiO_2$, and/or the silane coupling agent.

19. The silicone resin reflective substrate according to claim 1, wherein the white inorganic filler powder is contained in the polymerisable silicone resin in the ratio of 2 to 80% by mass.

20. The silicone resin reflective substrate according to claim 1, wherein the white inorganic filler powder and a fluorescent substance are dispersed and contained in the polymerisable silicone resin.

21. The silicone resin reflective substrate according to claim 1, wherein
the white inorganic filler powder and the fluorescent substance are dispersed and contained in the polymerisable silicone resin, and
at least a part of the white inorganic filler powder and the fluorescent substance is exposed to the air on a surface of the silicone resin reflective substrate.

22. The silicone resin reflective substrate according to claim 1, wherein the part of the white inorganic filler powder is exposed to the air on the surface of the silicone resin by treating at least a part of the surface of the silicone resin reflective substrate using polishing, roughening, die molding or stamp molding with using scabrous die, and/or chemical etching.

23. The silicone resin reflective substrate according to claim 1, wherein the silicone resin reflective substrate covers the support body to which a conductive pattern is attached, is polished, in manner such that the conductive pattern is exposed to the air.

24. The silicone resin reflective substrate according to claim 1, wherein a metal film is attached as conductive pattern to a surface of the silicone resin reflective substrate.

25. The silicone resin reflective substrate according to claim 1, wherein the metal film is made of at least one of a metal selected from the group consisting of Cu, Ag, Au, Ni and Pd.

26. The silicone resin reflective substrate according to claim 1, wherein the metal film is a plating film, a metal evaporating film, a metal spraying film or a bonded metal foil.

27. The silicone resin reflective substrate according to claim 1, wherein the silicone resin reflective substrate is arranged at a back side, an outer periphery and/or a reflective surface of a light guiding material of either one of a light emitting element, a light emitting device and a photoelectric conversion element.

28. The silicone resin reflective substrate according to claim 1, wherein the base material composition contains further a crosslinking agent for 3-dimensionally crosslinking the base material of the polymerisable silicone resin.

\* \* \* \* \*